| (12) | United States Patent | (10) Patent No.: | US 10,535,938 B2 |
|---|---|---|---|
| | Sherman et al. | (45) Date of Patent: | Jan. 14, 2020 |

(54) SIDE-EDGE CONNECTOR SYSTEM PROVIDING ELECTRICAL CONNECTION BETWEEN DEVICES IN A MANNER WHICH MINIMIZES DEDICATED CONNECTION SPACE

(71) Applicant: Tag-Connect, LLC, Burlingame, CA (US)

(72) Inventors: Neil Stanley Sherman, San Bruno, CA (US); Brian Joseph Eastman, San Jose, CA (US)

(73) Assignee: TAG-CONNET, LLC, Burlingame, CA (US)

( * ) Notice: Subject to any disclaimer, the term of this patent is extended or adjusted under 35 U.S.C. 154(b) by 0 days.

(21) Appl. No.: 15/917,271

(22) Filed: Mar. 9, 2018

(65) Prior Publication Data

US 2018/0261940 A1 Sep. 13, 2018

Related U.S. Application Data

(60) Provisional application No. 62/469,884, filed on Mar. 10, 2017.

(51) Int. Cl.
*H01R 12/72* (2011.01)
*H05K 5/00* (2006.01)
(Continued)

(52) U.S. Cl.
CPC ......... *H01R 12/721* (2013.01); *H01R 12/714* (2013.01); *H01R 13/50* (2013.01);
(Continued)

(58) Field of Classification Search
CPC .............. H01R 12/721; H01R 12/7005; H01R 13/6273; H01R 13/50; H01R 12/714;
(Continued)

(56) References Cited

U.S. PATENT DOCUMENTS 2,858,515 A * 10/1958 Thunander ............. H01R 13/26
 174/138 R
3,329,926 A * 7/1967 Aksu et al. ............ H01R 12/85
 439/260
(Continued)

FOREIGN PATENT DOCUMENTS

EP 0346206 A1 12/1989
EP 2473013 A1 7/2012

OTHER PUBLICATIONS

International Search Report and the Written Opinion dated May 24, 2018, in International Patent Appl. No. PCT/US2018/021721 filed Mar. 9, 2018.

*Primary Examiner* — Travis S Chambers
(74) *Attorney, Agent, or Firm* — Vierra Magen Marcus LLP

(57) ABSTRACT

Described herein are devices, systems and methods for accessing devices, such as modules or printed circuit boards (PCBs), for electrical communications. Various connectors described herein utilize a side-edge surface of a device, such as a PCB, for connectivity in order to maximize the surface area on the PCB upon which electronic components can be mounted. Such connectors can be used to temporarily connect to devices (e.g., PCBs) for the purposes of debugging, testing and/or configuring circuitry, firmware and/or software. Each such connector utilizes the side-edge surface of a device along its thickness to provide connectivity, which is useful in many situations, including when the device (e.g., a PCB) is to be soldered as a part onto a larger board at a later point in time, or where multiple PCBs are stacked.

36 Claims, 14 Drawing Sheets

(51) Int. Cl.
*H01R 13/627* (2006.01)
*H01R 13/50* (2006.01)
*H01R 12/71* (2011.01)
*H05K 7/10* (2006.01)

(52) U.S. Cl.
CPC ....... *H01R 13/6273* (2013.01); *H05K 5/0069* (2013.01); *H05K 7/1069* (2013.01)

(58) Field of Classification Search
CPC .............. H01R 2201/20; H01R 13/665; H05K 2201/09181; H05K 1/117; H05K 3/325; H05K 3/403; H05K 5/0069; H05K 7/1069
USPC ........... 439/71, 732, 488, 629, 951; 324/754
See application file for complete search history.

(56) References Cited

U.S. PATENT DOCUMENTS

| | | | | |
|---|---|---|---|---|
| 3,340,440 A * | 9/1967 | Minter | ................ | H01R 12/718 |
| | | | | 174/261 |
| 3,601,751 A | 8/1971 | Pauza | | |
| 4,072,387 A * | 2/1978 | Sochor | ................ | H01R 23/722 |
| | | | | 439/329 |
| 4,948,379 A * | 8/1990 | Evans | ................ | H01R 12/714 |
| | | | | 439/329 |
| 5,383,095 A * | 1/1995 | Korsunsky | ........... | H05K 3/3405 |
| | | | | 361/785 |
| 5,419,708 A * | 5/1995 | Koss | ...................... | H05K 1/117 |
| | | | | 439/59 |
| 5,963,045 A * | 10/1999 | Zink | ................. | G01R 1/07342 |
| | | | | 324/750.16 |
| 6,024,587 A * | 2/2000 | Garth | ................... | H05K 1/0218 |
| | | | | 439/101 |
| 6,142,831 A * | 11/2000 | Ashman | ................ | H01R 13/66 |
| | | | | 439/607.46 |
| 6,152,742 A | 11/2000 | Cohen et al. | | |
| 6,152,754 A * | 11/2000 | Gerhardt | ............ | H01R 13/5224 |
| | | | | 439/325 |
| 7,291,021 B2 | 11/2007 | Shirai et al. | | |
| 7,563,107 B2 | 7/2009 | Liao et al. | | |
| 7,740,486 B2 * | 6/2010 | Watanabe | .............. | H05K 1/117 |
| | | | | 439/493 |
| 8,282,402 B2 | 10/2012 | Ngo | | |
| 8,472,205 B2 * | 6/2013 | Gondosch | ............... | H01R 31/06 |
| | | | | 361/736 |
| 8,480,433 B2 * | 7/2013 | Huang | ................ | B60R 16/0232 |
| | | | | 439/34 |
| 8,692,124 B2 * | 4/2014 | Clayton | ................. | H01R 12/79 |
| | | | | 174/254 |
| 8,724,333 B2 * | 5/2014 | Leifer | .................... | H05K 1/141 |
| | | | | 361/728 |
| 9,306,359 B2 | 4/2016 | Li et al. | | |
| 9,549,483 B2 | 1/2017 | Tsuji et al. | | |
| 9,585,263 B2 * | 2/2017 | Matoy | ................... | H05K 3/325 |
| 9,887,475 B2 * | 2/2018 | Loy | ...................... | H01R 12/728 |
| 2005/0221632 A1 | 10/2005 | Sun et al. | | |
| 2011/0165792 A1 * | 7/2011 | Burns | .................. | H01R 13/465 |
| | | | | 439/488 |
| 2012/0071015 A1 * | 3/2012 | Debock | ................ | H01R 12/775 |
| | | | | 439/271 |
| 2013/0149878 A1 * | 6/2013 | Gao | ..................... | H01R 12/7082 |
| | | | | 439/62 |
| 2014/0242831 A1 * | 8/2014 | Strahl | .................... | F41F 3/052 |
| | | | | 439/374 |

\* cited by examiner

SIDE-EDGE CONNECTOR SYSTEM PROVIDING ELECTRICAL CONNECTION BETWEEN DEVICES IN A MANNER WHICH MINIMIZES DEDICATED CONNECTION SPACE

PRIORITY CLAIM

This application claims priority to U.S. Provisional Patent Application No. 62/469,884 filed on Mar. 10, 2017, incorporated herein by reference for all purposes.

BACKGROUND OF THE INVENTION

1. Field of the Invention

The present invention relates generally to connectors and more specifically it relates to connector features providing electrical connection between two devices in a manner which minimizes dedicated connection space and allows access to constrained devices.

2. Description of the Background Art

Any discussion of the related art throughout the specification should in no way be considered as an admission that such related art is widely known or forms part of common general knowledge in the field.

Connectors, such as electrical connectors, have been in use for years and are manufactured in various configurations and styles. A variety of electrical connectors are used to provide access to the electronics on printed circuit boards.

A printed circuit board (PCB) mechanically supports and electrically connects electronic components using conductive tracks, pads and other features etched from one or more sheet layers of electrically conductive materials (e.g., copper) which are laminated onto and/or between sheet layers of a non-electrically conductive substrate. PCBs can be single-sided (e.g., have one copper layer), double-sided (e.g., have two copper layers, with one on each of two sides of one substrate layer), or multi-layer (e.g., outer and inner layers of copper, alternating with layers of non-electrically conductive substrates). Multi-layer PCBs allow for much higher component density, because circuit traces on the inner layers would otherwise take up surface space between components. The rise in popularity of multilayer PCBs with more than two, and especially with more than four, electrically conductive (e.g., copper) planes was concurrent with the adoption of surface mount technology. Surface-mount technology (SMT) is a technology for producing electronic circuits in which the components are mounted or placed directly onto the surface of printed circuit boards (PCBs). An electronic device so made is called a surface-mount device (SMD). Often, electrical connectors are SMDs.

Surface mounted electrical connectors are soldered to a printed circuit board. Because of the small size of the connectors, soldering can often be a difficult and time-consuming process. In addition, there are a variety of disadvantages associated with surface mount technology. To begin, SMT is unsuitable for large, high-power, or high-voltage parts. Likewise, SMT is unsuitable for components that are subject to frequent mechanical stress, such as connectors that are used to interface with external devices that are frequently attached and detached. SMDs' solder connections may be damaged by potting compounds going through thermal cycling. In addition, on crowded circuit boards, the ability to accurately position and hold the connector while soldering can be increasingly difficult. Likewise, component-level repair is more difficult and requires skilled operators and more expensive tools, due to the small sizes and lead spacings of many SMDs. Another problem with soldering connectors is that the connector is secured in a relatively permanent manner and thus does not allow for easy removal of the connector. This makes it difficult to modify a circuit and/or replace failed components.

Although the use of surface mounted connectors has increased production process speed, the risk of defects has also increased due to component miniaturization and to the denser packing of boards. An SMT component is usually smaller than its through-hole counterpart because it has either smaller leads or no leads at all. It may have short pins or leads of various styles, flat contacts, a matrix of solder balls arranged in ball grid arrays (BGAs), or terminations on the body of the component. In addition, surface mounted connectors occupy valuable space on increasingly crowded boards, space which could otherwise be used for more frequently utilized components.

Other types of electrical connectors are also utilized that may allow for a connection in a manner other than through soldering. However, many of these connectors are often expensive or substantially fragile thus providing yet another inefficient manner in which to connect an electrical connector or component to a circuit board. Likewise, such connectors are typically large and bulky in relative size to the circuit board, which is typically becoming smaller and more crowded over time.

Because of the inherent problems with the related art, there is a need for a new and improved device for providing an electrical connection between devices, particularly between a device and a circuit board, in an efficient and cost-effective manner At least some of these objectives will be met by the present invention.

SUMMARY OF THE INVENTION

The present invention generally relates to devices, systems and methods for accessing devices for electrical communication. In particular, the present invention provides a connector system that utilizes a side-edge surface of a device, such as a module or printed circuit board (PCB), for connectivity. Typically, PCBs are planar, having a broad top surface and a broad bottom surface with a relatively thin thickness. This allows maximization of surface area upon which to mount electronic components. Since electronic devices are becoming smaller and smaller in size, the available surface area of PCBs is also becoming smaller. Often, there is a need to temporarily connect to PCBs for the purpose of testing or configuring circuitry, firmware, and/or software. The present invention provides for such connectivity without dedicating space on the broad planar surfaces of devices such as PCBs; this maximizes utilization of the available planar space for desired electronic components. The present invention utilizes the side-edge surface of the device along its thickness to provide connectivity. This is useful in many situations, including wherein the device, such as a PCB, is to be soldered as a part onto a larger board at a later point in time. This eliminates the need for an extra connector mounted on the device in addition to the larger board. Likewise, in some situations devices, such as PCBs, are stacked so that access to the broad planar surfaces are restricted. The present invention allows connectivity to the exposed side-edge surfaces of the PCBs.

In a first aspect of the present invention, a connector is provided for temporarily accessing a printed circuit board for electrical communication with the printed circuit board, wherein the connector comprises 1) a connector body having a mating region configured to engage a side-edge surface of the printed circuit board, wherein the mating region includes at least one electrical contact protruding outwardly from the mating region so that each of the at least one electrical contacts engages a corresponding receiving contact disposed along the side-edge surface of the printed circuit board when engaged with the mating region; and 2) electronic circuitry within the connector body electrically connected with the at least one electrical contact so as to allow at least one of programming, debugging, configuring, monitoring, testing, or state configuring connection of the printed circuit board.

In some embodiments, the connector further comprising an adapter configured for electrically connecting to an external electronic device and wherein the electronic circuitry is configured to allow transmission of electronic signals between the at least one electrical contact and the adapter during engagement of the side-edge surface of the printed circuit board with the mating region. In some embodiments, the adapter comprises a wireless transceiver configured to wirelessly electrically connect with the external electronic device. In some embodiments, the connector further comprises at least one wire electrically connecting the electronic circuitry with the adapter.

In some embodiments, the connector further comprises at least one alignment feature configured to ensure alignment of the printed circuit board with the mating region of the connector body so that each of the at least one electrical contacts engages the corresponding receiving contact disposed along the side-edge surface of the printed circuit board. In some embodiments, the at least one alignment feature comprises an alignment structure which engages an alignment receptacle in or on the printed circuit board. Optionally, the at least one alignment structure comprises a pin and the alignment receptacle comprises a hole, wherein the pin passes through the hole. Optionally, the at least one alignment structure comprises a protrusion and the alignment receptacle comprises an indent, wherein the protrusion mates with the indent.

In some embodiments, the mating region comprises a receiving platform for receiving a broad planar surface of the printed circuit board adjacent to the side-edge surface while each of the at least one electrical contacts engages its corresponding receiving contact. In some embodiments, the receiving platform is disposed between an outer edge of the connector body and an inner edge surface of the connector body so as to form a step shape, wherein the at least one electrical contact comprises a plurality of electrical contacts aligned in a row along the inner edge surface and extending outwardly from the inner edge surface over at least a portion of the receiving platform.

In some embodiments, each of the at least one electrical contacts comprises a wire which curves downward toward the receiving platform so that a curved portion of the wire is able to contact the corresponding receiving contact.

In some embodiments, the side-edge surface of the printed circuit board includes a series of notches and within each of the notches is disposed at least one of the at least one receiving contacts, and wherein: each of the curved portions are configured to extend into each of the notches to engage the receiving contact therein.

In some embodiments, the side-edge surface of the printed circuit board includes a series of notches and within each of the notches is disposed at least two of the at least one receiving contacts, and wherein: each of the curved portions are configured to extend into each of the notches to engage only one of the two receiving contacts therein.

In some embodiments, the inner edge surface includes a series of slots aligned with the plurality of electrical contacts wherein the wire of each of the plurality of electrical contacts emerges from a corresponding slot prior to curving downward toward the receiving platform, and wherein portions of the inner edge surface between each slot in the series of slots electrically isolate each of the plurality of electrical contacts from each other. In some embodiments, the receiving platform includes a plurality of grooves aligned with the series of slots, each groove configured to receive the curved portion of each of the plurality of electrical contacts so as to assist in maintaining separation and stability of the plurality of electrical contacts.

In some embodiments, the connector body comprises an additional mating region configured to engage a side-edge surface of an additional printed circuit board, wherein the additional mating region includes an additional at least one electrical contact protruding outwardly from the additional mating region so that each of the additional at least one electrical contact engages a corresponding receiving contact disposed along a side-edge surface of the additional printed circuit board when engaged with the additional mating region. In some embodiments, the mating region and the additional mating region are disposed in parallel with each other along a side of the connector body and wherein the mating region and the additional mating region are spaced apart so as to allow simultaneous engagement with the printed circuit board and the additional printed circuit board when in a stacked configuration. In other embodiments, the mating region and the additional mating region are disposed on different sides of the connector body and allow simultaneous engagement with the printed circuit board and the additional printed circuit board.

In a second aspect of the present invention, a connector system is provided comprising a device having a side-edge surface and at least one receiving contact disposed along the side edge surface; and a connector comprising 1) a connector body having a mating region, wherein the mating region includes at least one electrical contact protruding outwardly from the mating region so that the at least one electrical contacts engages the at least one receiving contact disposed along the side-edge surface of the device when engaged with the mating region, and 2) electronic circuitry within the connector body electrically connected with the at least one electrical contact so as to allow at least one of programming, debugging, configuring, monitoring, testing, or state configuring connection of the device.

In some embodiments, the side-edge surface comprises at least one a notch and wherein each of the at least one notch houses at least one of the at least one receiving contacts. Optionally, at least one of the at least one notch houses at least two of the at least one receiving contacts.

In some embodiments, the device comprises a printed circuit board.

In some embodiments, the connector further comprises an adapter configured for electrically connecting to a second device and wherein the electronic circuitry is configured to allow transmission of electronic signals between the at least one electrical contact and the adapter during engagement of the side-edge surface of the device with the mating region. Optionally, the adapter comprises a wireless transceiver configured to wirelessly electrically connect with the second device. In some embodiments, the connector system further comprises at least one wire electrically connecting the electronic circuitry with the adapter.

In some embodiments, the connector system further comprises at least one alignment feature configured to ensure alignment of the device with the mating region of the connector body so that each of the at least one electrical contacts engages the corresponding receiving contact disposed along the side-edge surface of the device. In some embodiments, the at least one alignment feature comprises an alignment structure which engages an alignment receptacle in or on the device. In some embodiments, the at least one alignment structure comprises a pin and the alignment receptacle comprises a hole, wherein the pin passes through the hole. In some embodiments, the at least one alignment structure comprises a protrusion and the alignment receptacle comprises an indent, wherein the protrusion mates with the indent.

In some embodiments, the mating region comprises a receiving platform for receiving a broad planar surface of the device adjacent to the side-edge surface while each of the at least one electrical contacts engages its corresponding receiving contact.

In some embodiments, the receiving platform is disposed between an outer edge of the connector body and an inner edge surface of the connector body so as to form a step shape, wherein the at least one electrical contact comprises a plurality of electrical contacts aligned in a row along the inner edge surface and extending outwardly from the inner edge surface over at least a portion of the receiving platform.

In some embodiments, each of the at least one electrical contacts comprises a wire which curves downward toward the receiving platform so that a curved portion of the wire is able to contact the corresponding receiving contact.

In some embodiments, the side-edge surface of the device includes a series of notches and within each of the notches is disposed at least one of the at least one receiving contacts, and wherein each of the curved portions are configured to extend into each of the notches to engage the receiving contact therein.

In some embodiments, the side-edge surface of the device includes a series of notches and within each of the notches is disposed at least two of the at least one receiving contacts, and wherein each of the curved portions are configured to extend into each of the notches to engage only one of the two receiving contacts therein.

In some embodiments, the inner edge surface includes a series of slots aligned with the plurality of electrical contacts wherein the wire of each of the plurality of electrical contacts emerges from a corresponding slot prior to curving downward toward the receiving platform, and wherein portions of the inner edge surface between each slot in the series of slots electrically isolate each of the plurality of electrical contacts from each other.

In some embodiments, the receiving platform includes a plurality of grooves aligned with the series of slots, each groove configured to receive the curved portion of each of the plurality of electrical contacts so as to assist in maintaining separation and stability of the plurality of electrical contacts.

In some embodiments, the connector body comprises an additional mating region configured to engage a side-edge surface of an additional device, wherein the additional mating region includes an additional at least one electrical contact protruding outwardly from the additional mating region so that each of the additional at least one electrical contact engages a corresponding receiving contact disposed along a side-edge surface of the additional device when engaged with the additional mating region.

In some embodiments, the mating region and the additional mating region are disposed in parallel with each other along a side of the connector body and wherein the mating region and the additional mating region are spaced apart so as to allow simultaneous engagement with the device and the additional device when in a stacked configuration.

In some embodiments, the mating region and the additional mating region are disposed on different sides of the connector body and allow simultaneous engagement with the device and the additional device.

In a third aspect of the present invention, a method is provided of temporarily accessing a printed circuit board for transmitting electronic signals between the printed circuit board and an external device, the method comprising 1) aligning a connector with the printed circuit board, wherein the connector has at least one electrical contact protruding outwardly from a surface of a connector body and electronic circuitry within the connector body electrically connected with the at least one electrical contact, and the printed circuit board has at least one side-edge surface having at least one receiving contact disposed thereon; and 2) mating the connector with the printed circuit board so that each of the at least one electrical contact engages one of the at least one receiving contact so as to allow transmission of electronic signals between the electronic circuitry and the printed circuit board for at least one of programming, debugging, configuring, monitoring, testing, or state configuring of the printed circuit board.

In some embodiments, wherein the connector has an adapter configured to electrically connect with an external electronic device, the method further comprises electrically connecting the adapter with the external device and transmitting electrical signals between the printed circuit board and the external device through the mated at least one electrical contact and the at least one receiving contact.

In some embodiments, transmitting electrical signals comprises forming a programming, debugging, configuring, monitoring, testing, state configuring connection between the printed circuit board and the external device.

In some embodiments, electrically connecting the adapter to the external device comprises mechanically connecting the external device with the adapter to form an electrical connection.

In some embodiments, the method further comprises disengaging the mated at least one electrical contact with the at least one receiving contact and removing the connector from the printed circuit board.

In some embodiments, aligning comprises aligning an alignment structure on the connector with an alignment receptacle in the printed circuit board. In some embodiments, when the alignment structure comprises a pin and the alignment receptacle comprises a hole, mating comprises passing the pin through the hole.

These and other embodiments are described in further detail in the following description related to the appended drawing figures.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

DETAILED DESCRIPTION OF THE INVENTION

Specific embodiments of the disclosed connectors and devices, and methods for use therewith will now be described with reference to the drawings. Nothing in this detailed description is intended to imply that any particular component, feature, or step is essential to the invention.

A variety of connectors are provided for making a temporary or permanent connection to a device, such as an electronic device, such as a printed circuit board (PCB), but not limited thereto. Such a connection can be made to debug, program, test, configure, monitor, inspect and/or set some state(s) of the electronic device, but is not limited thereto. Optionally the connection is used to form a debugging, programming, testing or state configuring connection between the device and an in-circuit debugger or debugger/programmer. In some embodiments, the connector has custom electronics for driving signals, for programming firmware or for wirelessly communicating with a monitoring/controlling device. In some embodiments, the connector attaches to more than one device at the same time, so as to perform these actions on multiple devices simultaneously (i.e., in parallel), in series, or in a sequence pattern, to name a few. In preferred embodiments, the connection is temporary, wherein the connector is removable from the device, such as when not in use. This allows the device to be accessed as needed without the disadvantages associated with surface mounted connectors. In particular, such removability eliminates any need for dedicated surface mount connector space on the device which is increasingly scarce in regard to printed circuit boards which are reducing in size and have limited space. In addition, the lack of surface mounting also allows connection to various types and configurations of devices which are not otherwise possible with conventional surface mount connectors.

The connectors of the present invention are configured to mate with a side-edge of a device, such as a printed circuit board (PCB). Typically, a PCB has a thin, flat structure in a variety of shapes, most commonly a rectangular shape. In the example of a rectangular shape, the PCB structure has two planar surfaces, such as a top and bottom, and four sides or edges, each termed a "side-edge". Such side-edges are typically narrow due to the thinness of the PCB. However, in each case there is a surface along the side-edge which is termed a "side-edge surface". This side-edge surface is utilized by the connectors of the present invention for accessing the PCB. Likewise, it may be appreciated that the connectors of the present invention may be utilized to access other devices having side-edges.

Figure 1:
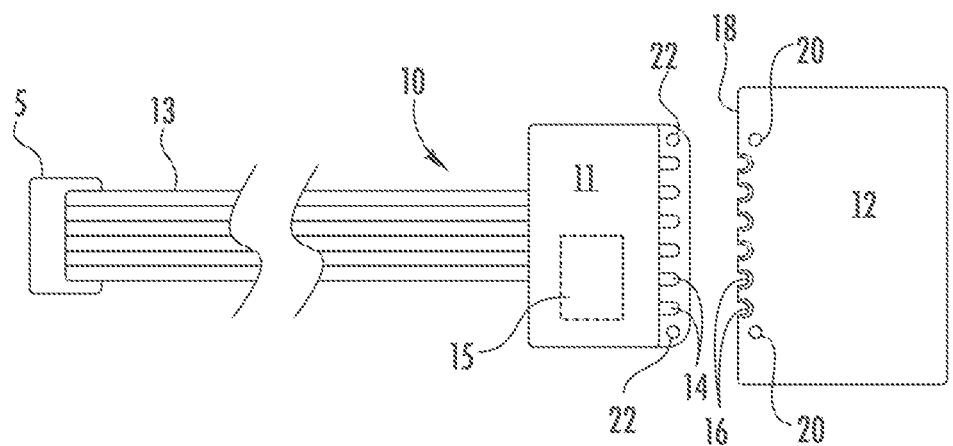
FIG. 1 illustrates an embodiment of a connector and a device, wherein the connector comprises a connector body having at least one electrical contact that engages a receiving contact on a side-edge surface of the device.

Accessing side-edges allows the connector to access, for example, individual boards, boards mounted on larger boards, and stacked boards. In some embodiments, the connector is able to mate with more than one side-edge at a time. Likewise, the connector is able to mate with side-edges of various shapes and configurations. FIG. 1 illustrates an embodiment of a connector 10 and a device 12, wherein the device 12 represents a printed circuit board. In this embodiment, the connector 10 comprises a connector body 11 having at least one electrical contact 14 that engages a receiving contact 16 on a side-edge surface 18 of the device 12. The connector 10 also include electronic circuitry 15 which allows for transmission of electronic signals between at least one electrical contact of the connector body 11 and another device that is used for, for example, programming, debugging, configuring, monitoring, or testing of the device 12 to which the connector body 11 is engaged. In some embodiments, device 12 includes at least one alignment receptacle 20 to assist in orientation and stability of the connection. Each alignment receptacle 20 mates with an alignment structure 22 on the connector body 11 to stabilize the connection and maintain the mated arrangement. In this embodiment, the alignment receptacle 20 comprises a hole and the alignment structure 22 comprises a pin. In some embodiments, the alignment receptacle 20 includes a receiving contact 16 while the alignment structure 22 includes an electrical contact 14. In these embodiments, mating of the receptacle 20 with the structure 22 also mates the associated receiving contact 16 with the associated electrical contact 14 to serve as an electrical connection. Typically, the device 12 includes other electrical components, such as when the device 12 comprises a printed circuit board. Such a printed circuit board can include one or more circuits mounted thereon and/or embedded therein.

Figure 2:
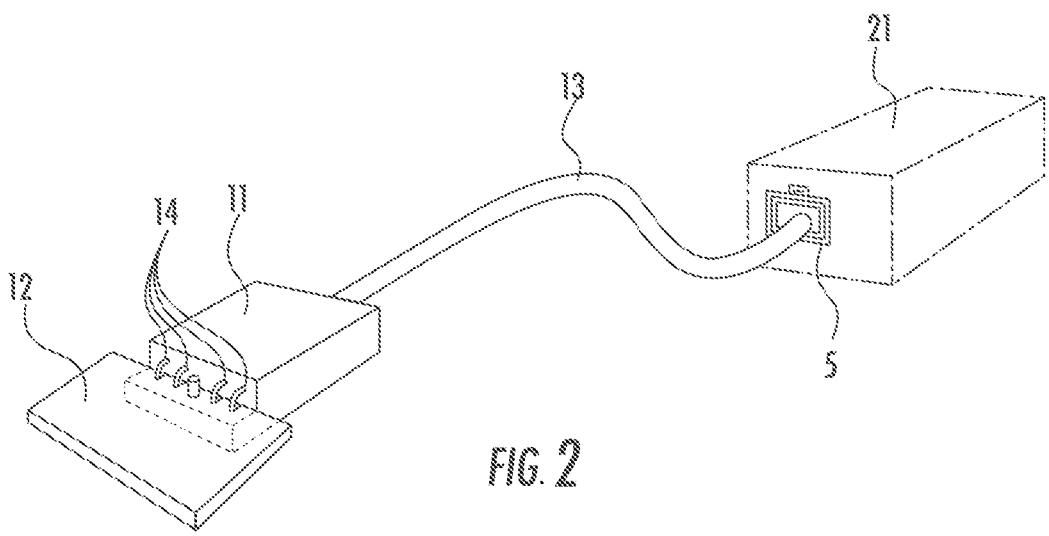
FIG. 2 illustrates an embodiment of a connector engaged with a device, wherein the connector includes an adapter configured to physically connect with another device.

In this embodiment, the connector 10 also includes an adapter 5 for electrical connection with another device 21, shown in FIG. 2. It may be appreciated that the adapter 5 may be configured to physically connect with the other device 21 to make the electrical connection (as illustrated in FIG. 2), or the adapter 5 may be configured to provide wireless electrical communication with the other device 21. It may also be appreciated that the adapter 5 may be connected to the connector body 11 by a cable 13 or similar device, as illustrated in FIG. 1 and FIG. 2. In some embodiments, the cable 13 comprises a ribbon cable or a cable with many conducting wires running parallel to each other, as illustrated in FIG. 1. In other embodiments, the cable 13 comprises a cord having a conductor or group of conductors bundled together, as illustrated in FIG. 2. It may be appreciated that in embodiments utilizing wireless communication, the adapter 5 may be comprised of a wireless transceiver. In such embodiments, the wireless transceiver may be housed within the connector body 11 and no cable 13 is present.

Figure 3A:
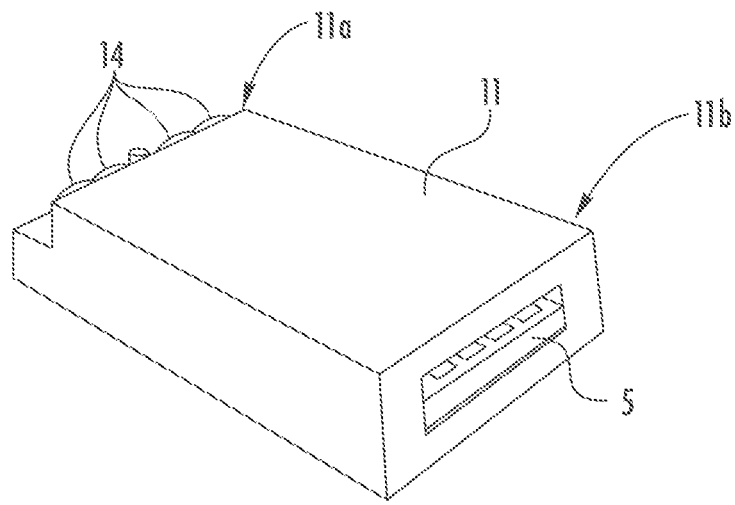
FIGS. 3A-3B illustrate embodiments of a connector body having an adapter incorporated into a portion of the connector body.
Figure 3B:
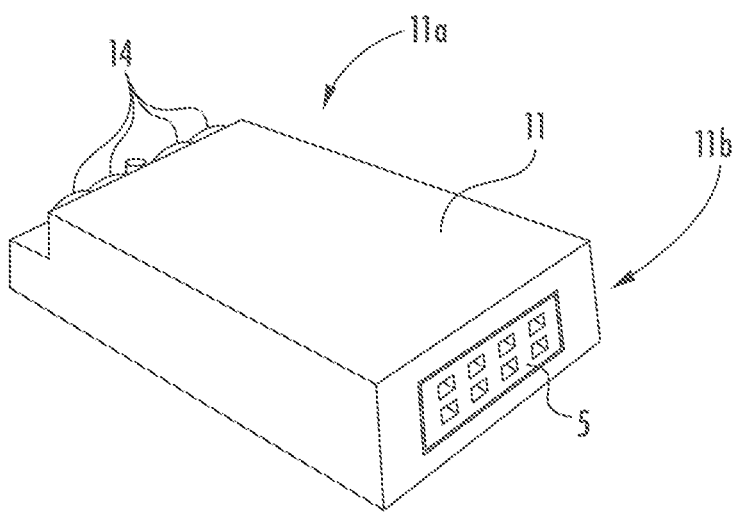

In some embodiments, the adapter 5 is directly attached to or incorporated in the connector body 11 for physical connection with the other device 21. For example, FIGS. 3A-3B illustrate embodiments of a connector body 11 having an adapter 5 incorporated into an exterior portion of the connector body 11. In these embodiments, the connector body 11 has a rectangular shape wherein the at least one electrical contact 14 is disposed along a first end 11a and the adapter 5 is disposed along a second end 11b which is opposite to the first end 11a. FIG. 3A illustrates an adapter 5 having the form of a female Universal Serial Bus (USB) A-type port. FIG. 3B illustrates an adapter 5 having the form of a female header configured to mate with pins. It should be appreciated that the adapter 5 can have alternative types of female or male type connector components.

Still further, the connector body 11 may be directly attached to or formed with another connector body 11' (not specifically shown) for connecting another device 12' (not specifically shown). In such embodiments, the pair of connectors 11, 11' may be joined in any configuration, including back to back wherein the at least one electrical contact 14 of connector 11 faces in an opposite direction to the at least one electrical contact 14 of connector 11'. In such an arrangement, the pair of connectors 11, 11' may be used to connect or join modular devices together, such as boards of LED lighting modules.

Figure 4:
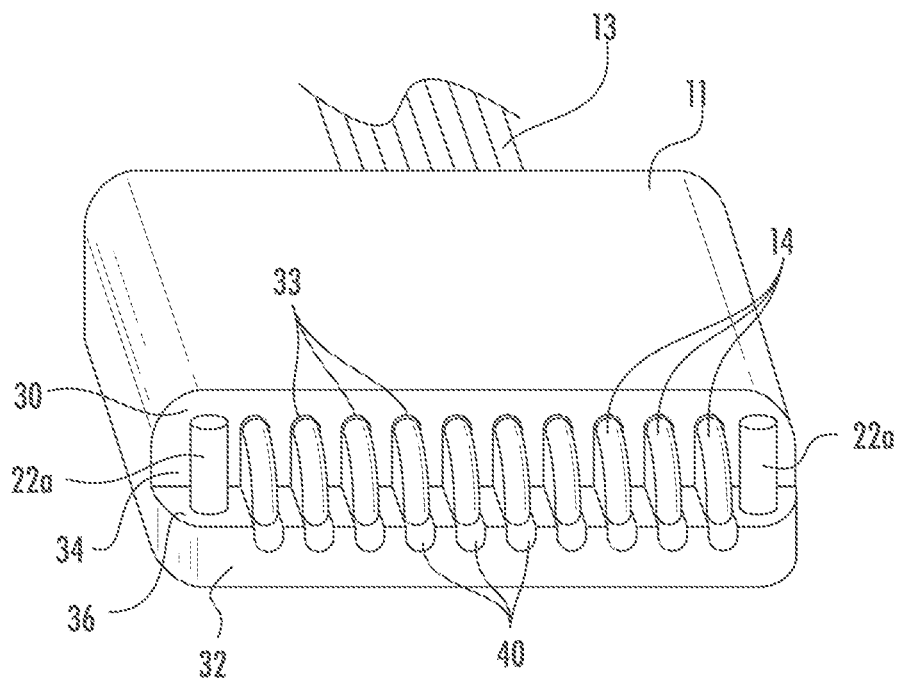
FIG. 4 is a perspective view of an embodiment of a connector body.

FIG. 4 is a perspective view of an embodiment of the connector body 11. In this embodiment, the connector body 11 includes a plurality of electrical contacts 14 aligned along an inner edge 30 of the body 11. The inner edge 30 is set in from a parallel outer edge 32 forming a mating region 34 having a step shape. The mating region 34 is the area along the connector body 11 which receives portions of the device 12 during connection. In this embodiment, the mating region 34 is comprised of two surfaces which form a 90-degree angle. Here, one of the surfaces is the inner edge 30 and the other surface is a receiving platform 36 for receiving a planar surface of the printed circuit board adjacent to the side-edge surface (i.e. top surface of a step) extending to the outer edge 32. However, it may be appreciated that the mating region 34 may have a variety of shapes and configurations, including having surfaces forming various angles.

The electrical contacts 14 may be comprised of any suitable electrically conductive material, such as metal, alloy, wire, copper wire, phosphor bronze plated wire, laser cut sheet metal, pressed sheet metal, and/or wire-electrical discharge machined sheet metal. Likewise, it may be appreciated that any number of electrical contacts 14 may be provided, including one, two, three, four, five, six, seven, eight, nine, ten or more. Typically, the number of electrical contacts 14 is chosen based on the desired or required number of signals needed for debugging, programming, monitoring, testing or providing specific functionality or communication.

In this embodiment, each electrical contact 14 is disposed in an individual slot 33 along the inner edge 30 of the connector body 11. Here, the slots 33 are evenly spaced along the inner edge 30 and portions of the connector body 11 between the slots 33 insulate the contacts 14 from each other and maintain separation. In this embodiment, each electrical contact 14 has a curved, rounded or bowed shape extending outward through its slot 33, extending beyond the inner edge 30 of the connector body 11 and over the receiving platform 36. In this embodiment, the receiving platform 36 includes a plurality of grooves 40, each groove 40 aligned with a slot 33 and a corresponding contact 14. Thus, each contact 14 curves or extends into at least a portion of a respective groove 40, further maintaining separation and stability of the contacts 14. It may be appreciated that a variety of alignment features may be included to ensure desired orientation for mating and/or to thwart or discourage incorrect mating, such as mating of incompatible devices, mating with an incorrect portion of the device, mating upside-down, etc. Such alignment features may include variations in, for example, spacing, size or shape, of electrical contacts 14, slots 33 and/or grooves 40. Likewise, such features may include keys or notches to guide orientation during mating. As mentioned, in some embodiments, the connector body 11 also includes at least one alignment structure 22. In this embodiment, the alignment structures 22 are comprised of pins 22a disposed along the receiving platform 36 and extending vertically upward. As shown, the electrical contacts 14 are between the pins 22a, however it may be appreciated that the pins 22a may be disposed in any suitable location for aligning and maintaining the device 12 along the mating surface 34. It may be appreciated that in some embodiments, when multiple pins 22a are present, the pins 22a may be of differing diameter than one another or may have particular features that different than one another to assist in guiding desired orientation and/or to thwart or discourage incorrect mating.

The at least one alignment structure 22 may be comprised of any suitable material, including electrically conductive and/or electrically non-conductive materials. In some embodiments, the at least one alignment structure 22 is molded as part of the connector body 11. In other embodiments, the at least one alignment structure 22 is attached to the connector body 11, either comprised of the same or differing material than the connector body 11. In some embodiments, the at least one alignment structure 22 is comprised of wire or precision cut metal. When the at least one alignment structure 22 includes a conductive material, the conductive material may act as an electrical contact 14. In such embodiments, the associated alignment receptacle 20 includes a receiving contact 16 such that mating of the receptacle 20 with the structure 22 also serves as an electrical connection and optionally may ensure a specific sequence of signal connection (such as ground and power first to ensure the ground and power connections are made prior to other signals, helping to ensure safe "hot-connections).

Figure 5:
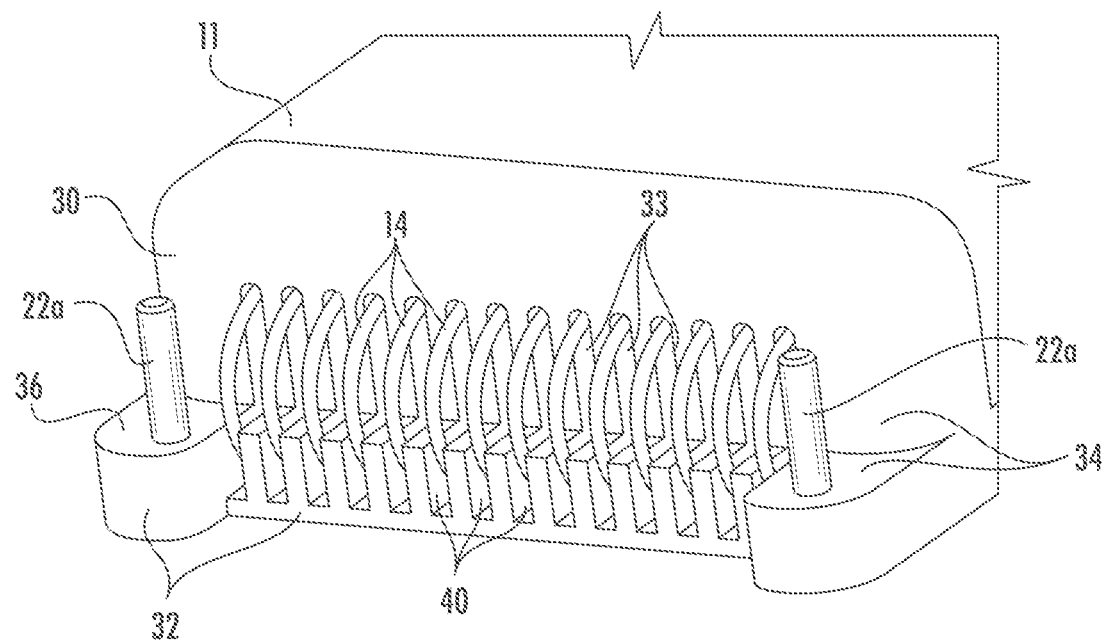
FIG. 5 is a perspective view of another embodiment of a connector body.

FIG. 5 illustrates a similar embodiment of a connector body 11. Here, the connector body 11 includes a plurality of electrical contacts 14 aligned along an inner edge 30 of the body 11. Again, the inner edge 30 is set in from a parallel outer edge 32 forming a mating region 34 having a step shape. And, in this embodiment, each electrical contact 14 is disposed in a respective individual slot 33 along the inner edge 30 of the connector body 11. In this embodiment, the receiving platform 36 includes a plurality of grooves 40, each groove 40 aligned with a respective slot 33 and a corresponding contact 14. In this embodiment, the grooves 40 are set slightly deeper into the receiving platform 36 in comparison to FIG. 4 and each contact 14 curves or extends into a respective groove 40, further maintaining separation and stability of the contacts 14. In addition, in this embodiment, the outer edge 32 contours inward in the area of the grooves 40.

Figure 6:
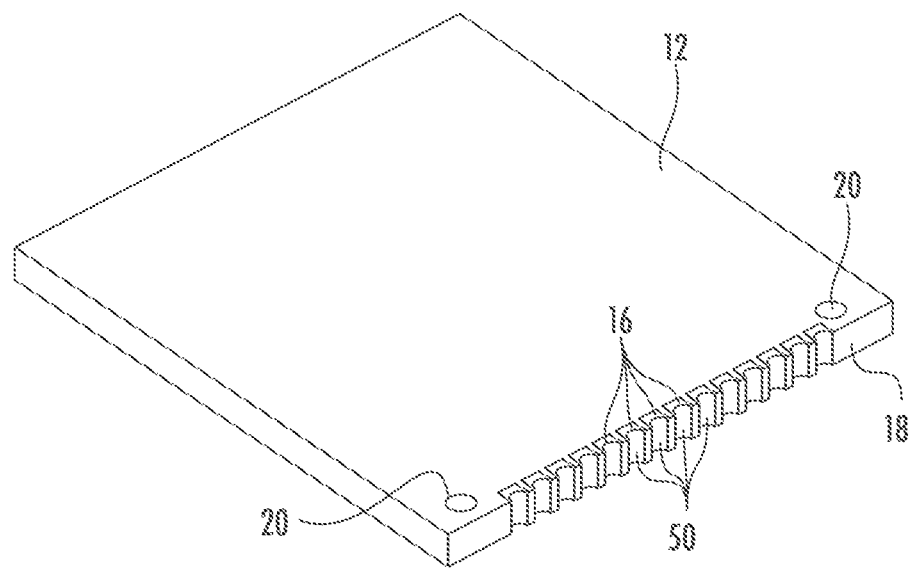
FIG. 6 illustrates an embodiment of a device having at least one receiving contact.

FIG. 6 illustrates an embodiment of a device 12 (e.g., a PCB) having at least one receiving contact 16. In this embodiment, device 12 includes a plurality of receiving contacts 16 disposed along a side-edge surface 18. It may be appreciated that the receiving contacts 16 may have a variety of shapes, such as flat, arc, square, triangular, etc. In this embodiment, the contacts 16 are arc shaped, wherein each contact 16 resides in a castellated notch 50 along the side-edge surface 18. The notches 50 may be formed such as by making a half-hole through the side-edge surface 18. This results in castellations or castellated notches 50 along the side-edge surface 18. The castellated notches 50 are plated to form the electrical contacts 16. It may be appreciated that the notches 50 may be arc shaped, square shaped, rectangular shaped, triangular shaped or other shaped. In this embodiment, the device 12 also includes alignment receptacles 20 which are disposed near the contacts 16 so as to mate with the alignment structures 22 (e.g., the pins 22a in FIG. 5) when in the mating arrangement. It may be appreciated that in some embodiments, the side-edge surface 18 is flat, without notches, wherein the side-edge surface 18 is plated to provide one or more receiving contacts 16. Further, it may be appreciated that in some embodiments, the receiving contacts 16 protrude from the side-edge surface 18. In such embodiments, the electrical contacts 14 on the connector body 11 may be of suitable configuration to mate with the receiving contacts 16, such as having a flat, recessed or non-protruding shape or configuration.

Figure 7:
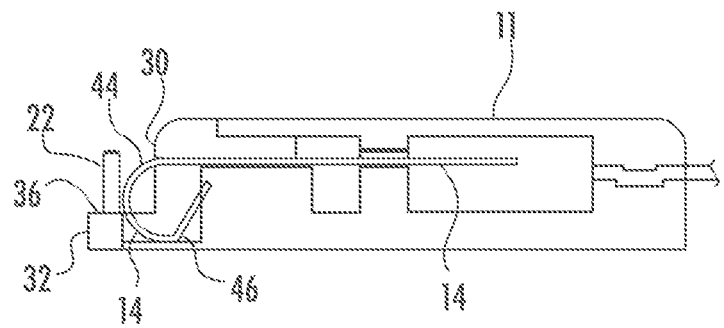
FIG. 7 illustrates a side-view of an embodiment of a connector body having at least one electrical contact comprising a spring wire.

FIG. 7 illustrates a side-view of an embodiment of a connector body 11 having at least one electrical contact 14 comprising a spring wire. In this embodiment, the spring wire includes a first curved portion 44 which curves or bows outwardly from the outer edge 32 and slot 33 and curves back inwardly in the groove 40, and wherein the spring wire includes a second curved portion 46 within the connector body 11. In this embodiment, the second curved portion 46 has a sharper curve than the first curved portion 44, as shown. Such dual curvature provides additional flexibility and springiness.

Figure 8:
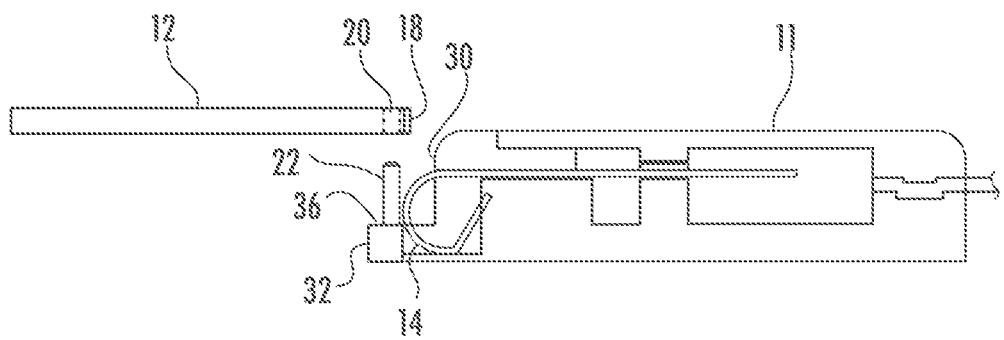
FIG. 8 illustrates alignment of the connector body of FIG. 7 and the device for mating.
Figure 9:
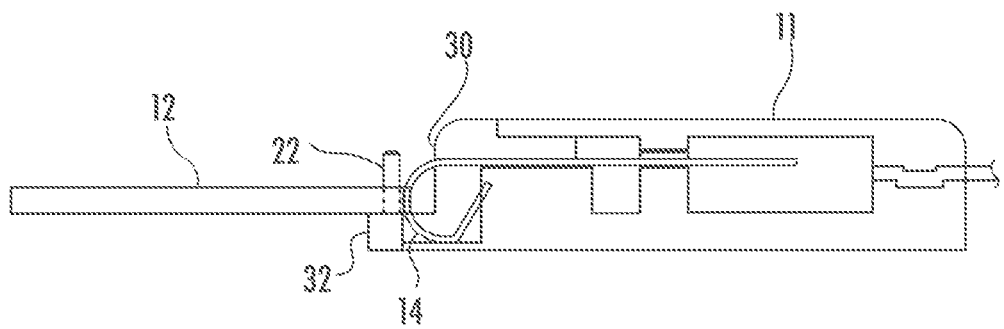
FIG. 9 illustrates the connector body and the device in a mated configuration.
Figure 10:
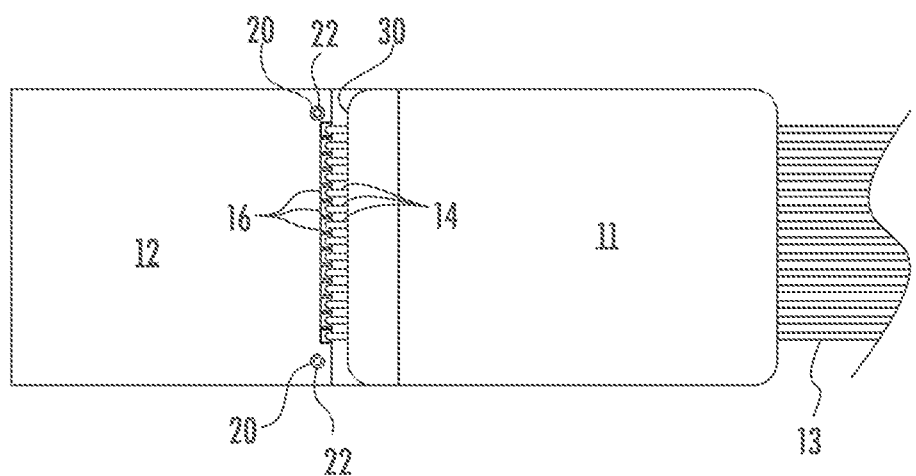
FIG. 10 is a top view illustration of an embodiment of a connector body engaged with the device of FIG. 6.

FIG. 8 illustrates alignment of the connector body 11 of FIG. 7 and the device 12 (e.g., of FIG. 6) for mating. As shown, the device 12 is positioned so that a side-edge surface 18 having at least one receiving contact 16 aligns with the inner edge 30 of the connector body 11. Likewise, alignment receptacles 20 are concentrically aligned with the alignment structures 22. This provides a small overlap between the device 12 and the body 11 over the receiving platform 36. This overlap provides additional stability during connection. To mate the connector body 11 with the device 12, the device 12 is lowered so that the alignment structures 22 pass through the receptacles 20 of the device 12 and the electrical contacts 14 engage the receiving contacts 16, as illustrated in FIG. 9. Alternatively, the device 12 is held still and the connector body 11 is raised so that the alignment structures 22 pass through the receptacles 20 of the device 12 and the electrical contacts 14 engage the receiving contacts 16, as illustrated in FIG. 9. Additionally, FIG. 10 provides a top view of the connector body 11 (of FIGS. 5 and 7-9) engaged with the device 12 of FIG. 6. The alignment receptacles 20 are generally close fitting with respect to the alignment structures 22 and assist in stabilizing the mated configuration. In this mated arrangement, the side-edge surface 18 of the device 12 having the receiving contacts 16 aligns in parallel with the inner edge 30 surface and the protruding contacts 14 are received by the castellated notches 50 of the receiving contacts 16. In this embodiment, the electrical contacts 14 are flexible and spring-like so as to ease mating and to ensure contact between the electrical contacts 14 of the connector 10 and receiving contacts 16 of the device 12. In addition, the contacts 14 may push downwards and outwards on the device 12, and optionally into one or more alignment structures 22, which also creates a downwards locating force on for device 12.

When removing the device 12 from the connector body 11, the device 12 is simply raised to disengage the alignment structures 22 from the receptacles 20. The device 12 is then removed and is used for its designated purposes. The device 12 can be re-engaged by repeating the steps described with reference to FIGS. 7-10 as desired.

It may be appreciated that in other embodiments connector body 11 and device 12 may be mated in varying configurations. For example, in some embodiments, the alignment structures 22 are angled toward edge 30. Such angling may assist in securely seating device 12 on the receiving platform 36.

Figure 11A:
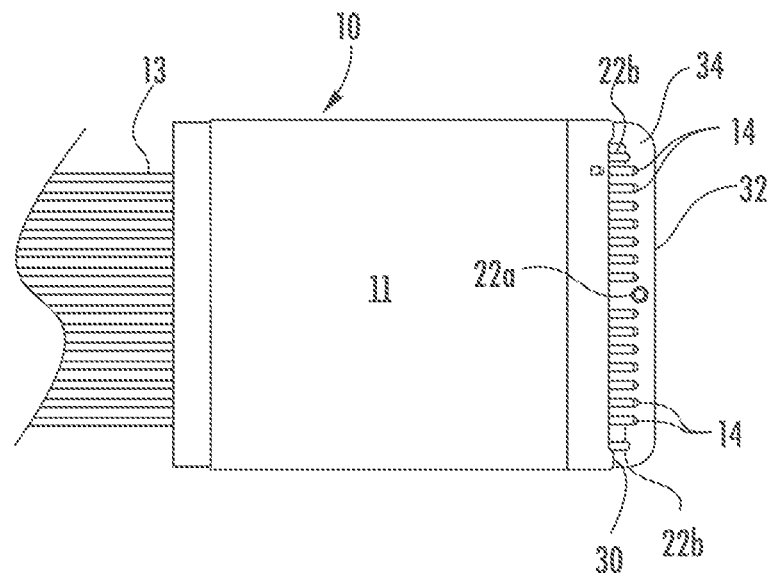
FIGS. 11A-11B illustrate an embodiment of a connector body which includes a plurality of alignment structures, including an alignment pin and two alignment protrusions.
Figure 11B:
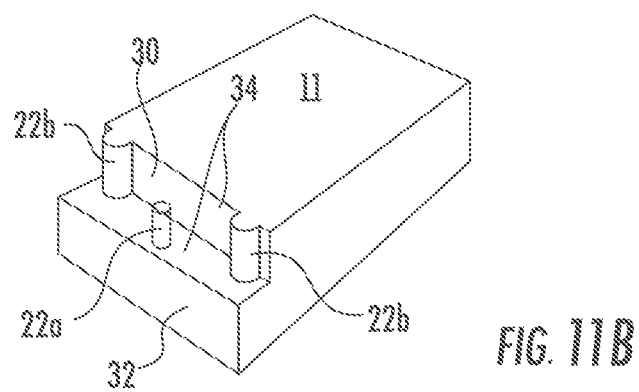
Figure 12:
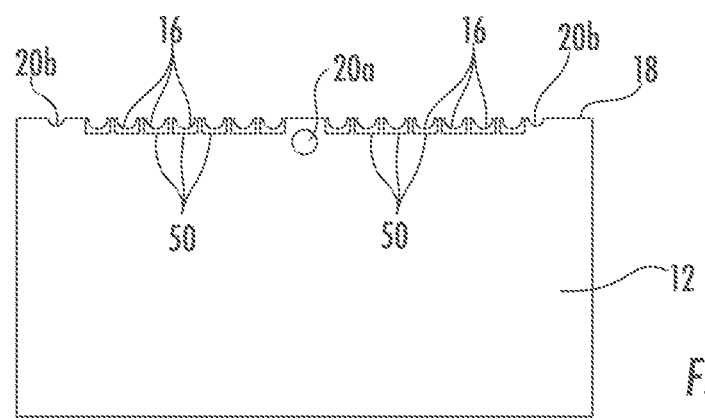
FIG. 12 illustrates a device configured to mate with the mating region of the connector body in FIG. 11A.

FIGS. 11A-11B illustrate another embodiment of a connector body 11. In this embodiment, the connector body 11 includes a plurality of alignment structures, including an alignment pin 22a and two alignment protrusions 22b. FIG. 11A provides a top view illustration of an embodiment of a connector body 11 having a plurality of electrical contacts 14 aligned along an inner edge 30 of the body 11. The inner edge 30 is set in from a parallel outer edge 32 forming a mating region 34 having a step shape. The mating region 34 is the area along the connector body 11 which receives portions of the device 12 during connection. In this embodiment, the alignment pin 22a is disposed along the mating region 34, near the outer edge 32, and extends vertically upward. In addition, in this embodiment the outer edge 32 curves laterally outwardly in the vicinity of the alignment pin 22a so as to provide a stable foundation therearound the pin 22a. In this embodiment, the alignment pin 22a is substantially centered along the plurality of electrical contacts 14 forming a row so that an equal number of contacts 14 are disposed on either side of the pin 22a. In addition, the alignment structures include two alignment protrusions 22b, each protrusion 22b extending laterally outwardly from the inner edge 30 toward the outer edge 32. In this embodiment, the alignment protrusions 22b are arranged so that the plurality of electrical contacts 14 reside between the protrusions 22b (i.e. the contacts 14 form a row and the protrusions reside at the ends of the row). FIG. 11B provides a simplified perspective illustration of the connector body 11 showing the positions of the alignment pin 22a and two alignment protrusions 22b (to avoid clutter in the drawing, FIG. 11B does not show the electrical contacts 14, but it should be appreciated that they would be present). It may be appreciated that other arrangements may be utilized; for example, alignment pins 22a may be positioned at the ends of the row of contacts 14 and a protrusion 22b may be centered, any number of pins 22a and/or protrusions may be positioned along the mating region 34, etc. FIG. 12 illustrates a device 12 configured to mate with the mating region 34 of the connector body 11 in FIG. 11A. Here, the device 12 has a plurality of receiving contacts 16 disposed along a side-edge surface 18. In particular, each receiving contact 16 is located within a castellated notch 50 along the side-edge surface 18. In addition, the device 12 also includes an alignment receptacle 20 in the form of a hole 20a which is disposed near the contacts 16 and centered so as to mate with the alignment pin 22a when in the mating arrangement. In addition, the device 12 also includes a pair of alignment receptacles 20, each in the form of an indent 20b disposed along the side-edge surface 18 so as to mate with the alignment protrusions 22b when in the mating arrangement. Thus, each indent 20b is located at opposite ends of the row of castellated notches 50. The alignment structures 22 and receptacles 20 assist in orienting the device 12 to the connector body 11 and stabilizing the connection. It may be appreciated that non-symmetric placement of the alignment structures 22 and/or receptacles 20 may further assist in orienting the device 12, such as to ensure that the device 12 is not inverted or rotated when mated with the connector body 11.

Figure 13:
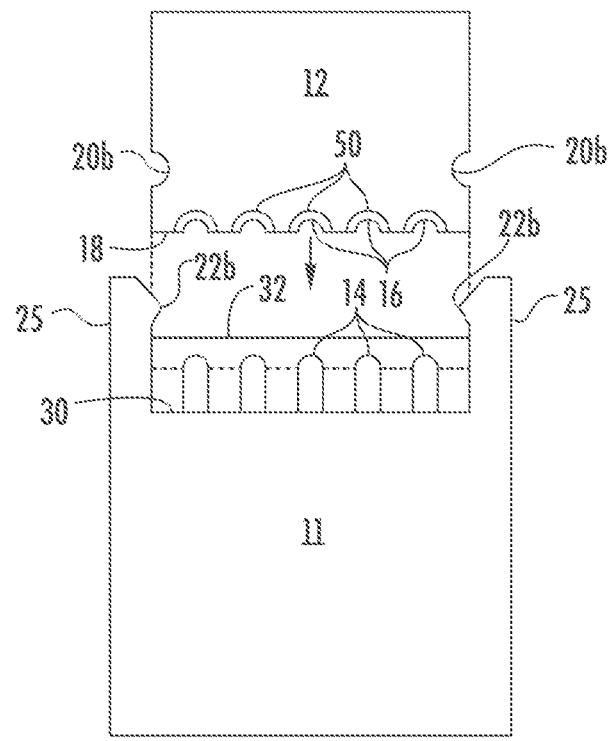
FIG. 13 illustrates another embodiment of a connector body having alignment structures for aligning and stabilizing a device during mating.

FIG. 13 illustrates another embodiment of a connector body 11 having alignment structures for aligning and stabilizing a device 12 during mating. In this embodiment, the connector body 11 includes a pair of arms 25 which extend laterally outwardly so as to extend beyond the outer edge 32. The arms 25 are configured so as to be disposed along side-edges of the device 12 which are perpendicular to the side-edge 18 mating with the electrical contacts 14, when the device 12 is mating with the connector body 11. In this embodiment, each arm 25 includes an alignment protrusion 22b extending toward the device 12 so as to mate with an alignment indent 20b disposed along the side-edge of the device 12 which is perpendicular to the side-edge 18 mating with the electrical contacts 14. Thus, in this embodiment, the alignment protrusions 20b face each other and interlock with the device 12, holding the device 12 therebetween.

Figure 14:
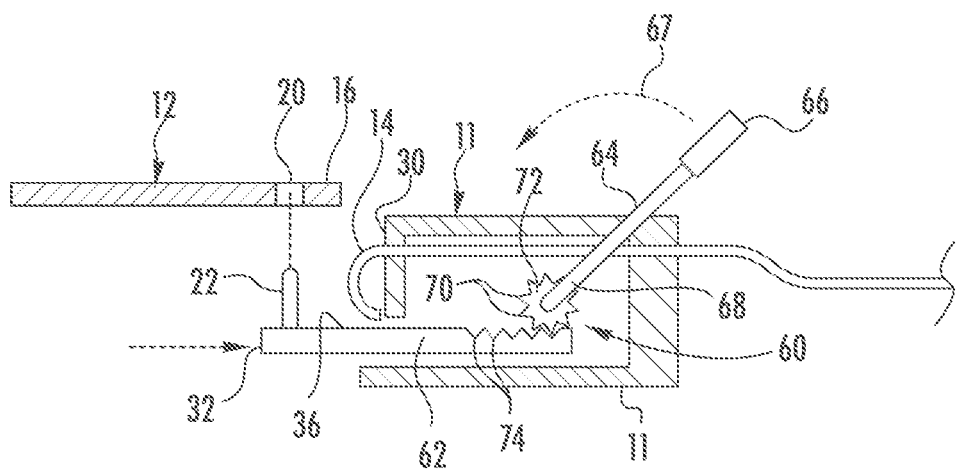
FIG. 14 illustrates an embodiment of a connector body configured to adjust the position of the device in relation to the connector body, such as to engage the device with the electrical contacts.

FIG. 14 illustrates a cross-sectional side view of an embodiment of a connector body 11 configured to adjust the position of the device 12 in relation to the connector body 11, such as to engage the device 12 with the electrical contacts 14. In this embodiment, the connector 10 includes an adjustment mechanism 60 which draws the device 12 toward the electrical contacts 14 by actuation of the mechanism 60. In this embodiment, the connector body 11 includes a plurality of electrical contacts 14 (although only one is showing in FIG. 14 due to the side view) aligned along an inner edge 30 of the body 11. The inner edge 30 is set in from a parallel outer edge 32 forming a mating region having a step shape. In this embodiment, the mating region is comprised of two surfaces which form a 90 degree angle. Here, one of the surfaces is the inner edge 30 and the other surface is a receiving platform 36 having the outer edge 32. In this embodiment, the receiving platform 36 and outer edge 32 are formed by a movable plate 62 which moves laterally toward and away from the electrical contacts 14. Such movement is actuated by the adjustment mechanism 60 which is attached to and/or formed with the movable plate 62. In this embodiment, the adjustment mechanism 60 comprises a lever 64 which engages a portion of the movable plate 62. Here the lever 64 comprises an elongate shaft having a free end 66 and an engagement end 68. The engagement end 68 includes a plurality of cogs or teeth 70 extending at least partially around a wheel 72 wherein the teeth 70 are configured to engage grooves or recesses 74 in a surface of the movable plate 62. Thus, the lever 64 rotates about a center of the wheel 72 when the free end 66 is moved forward or backward. In this embodiment, forward movement of the free end 66 (as indicated by arrow 67) causes the teeth 70 to rotate and engage with the recesses 74 of the movable plate 62 so as to draw the plate 62 inwards moving the outer edge 32 toward the electrical contacts 14. Likewise, reverse or backward movement of the free end 66 causes the teeth 70 to reverse rotate and engage the recesses 74 of the movable plate 62 so as to extend the plate 62 outwardly so that the outer edge 32 moves away from the electrical contacts 14. Thus, when a device 12 is mounted on the receiving platform 36 and stabilized, such as with engagement of an alignment structure 22 with an alignment receptacle 20, forward movement of the lever 64 draws the receiving contacts 16 toward the electrical contacts 14 of the connector body 11 and engages the contacts 14, 16 with each other. Then, when disengagement of the device 12 is desired, the lever 64 is moved in the reverse direction which moves the receiving contacts 16 away from the electrical contacts 14. This may assist in mating the device 12 with the connector 10, such as by allowing more space with which to mount the device 12 and varied levels of pressure between the contacts 14, 16. It may be appreciated that other mechanisms may be used, such as utilizing latches.

Figure 15:
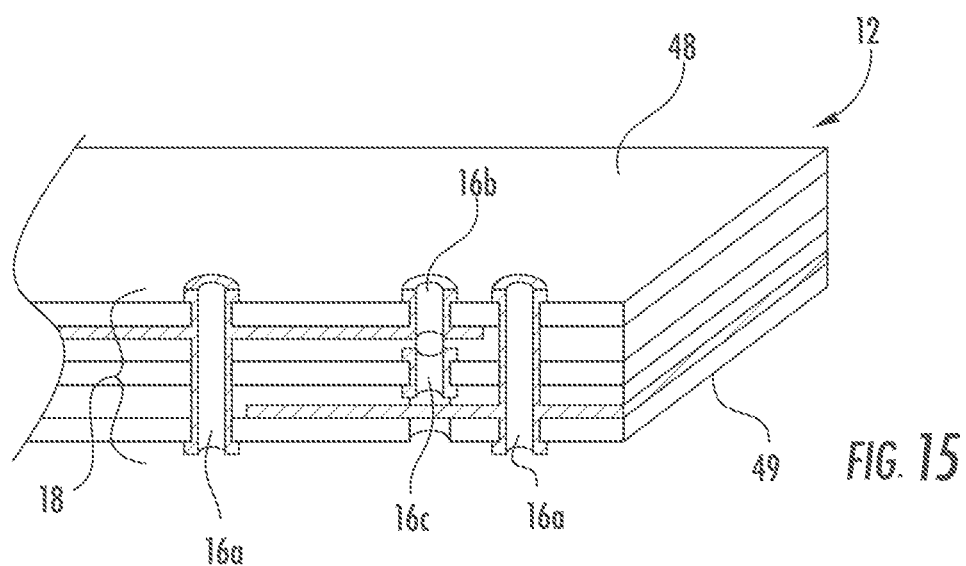
FIG. 15 illustrates a device having a plurality of different types of receiving contacts along a side-edge surface.

It may be appreciated that some receiving contacts 16 on device 12 may extend fully across the side-edge surface 18, thus bridging the top planar surface and the bottom planar surface of the device 12. However, it may be appreciated that some receiving contacts 16 may only extend partially across the side-edge surface 18, thus acting similar to buried vias or a blind vias. FIG. 15 illustrates a device 12 having a plurality of receiving contacts 16 along side-edge surface 18. As shown, receiving contacts 16a extend fully across the side-edge surface 18, bridging top planar surface 48 and bottom planar surface 49 of the device 12. In contrast, contact 16b extends partially across the side-edge surface 18 from the top planar surface 48, thus acting similar to a buried via. Likewise, contact 16c extends partially across the side-edge surface 18 between but not contacting the top planar surface 48 or bottom planar surface 49, thus acting similar to a blind via. When receiving contacts 16 are disposed within alignment receptacles 20, such receiving contacts 16 may act as buried vias or blind vias.

It may be appreciated that each receiving contact 16 may be comprised of several small layer-to-layer platings rather than one plating connecting all layers of the device 12. For example, a four-layer device 12 (top, upper middle layer, lower middle layer, bottom) may have a notch 50 plated between a top and upper middle layer, and another plating between lower middle layer and the bottom. Each plated portion may serve as a receiving contact 16. It may be appreciated that a device 12 may include any combination of differing types of receiving contacts 16.

Figure 16:
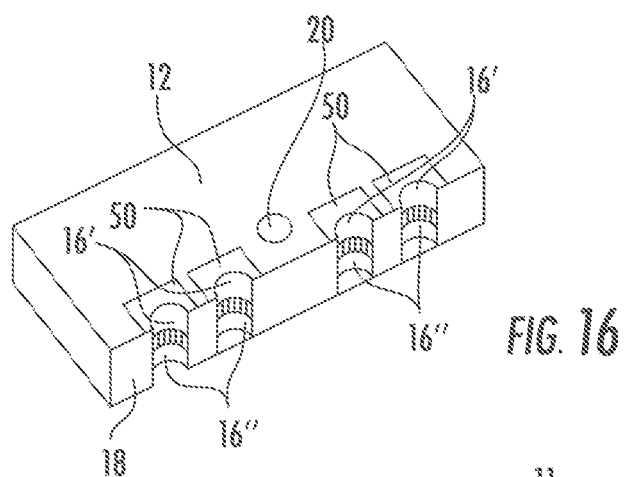
FIG. 16 illustrates an embodiment of a device having a plurality of notches along a side-edge surface, each notch including a plurality of receiving contacts (e.g. a first receiving contact and a second receiving contact stacked with a non-electrically conductive layer therebetween).
Figure 17:
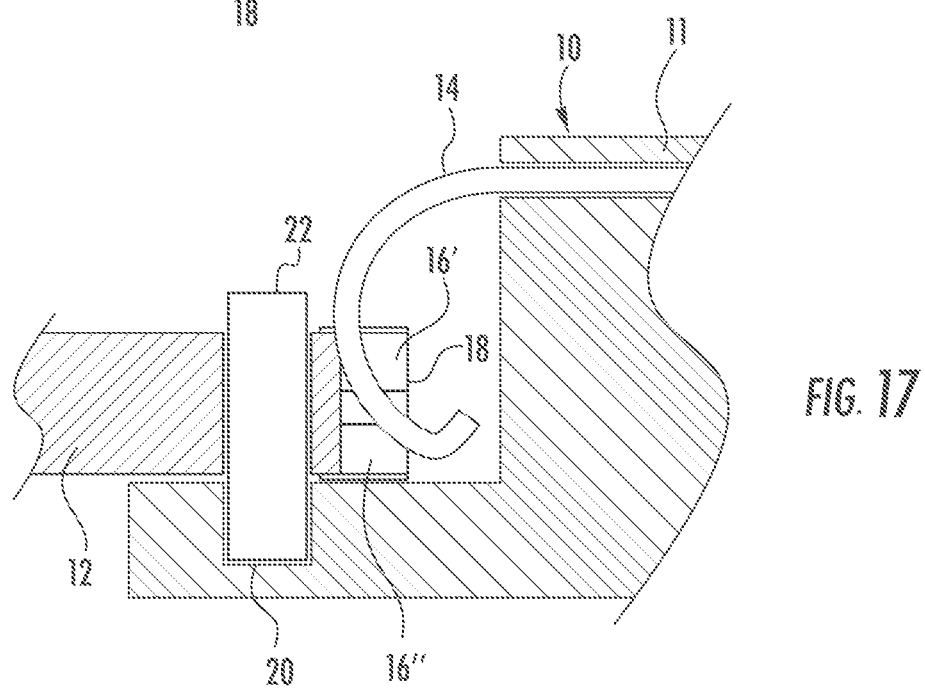
FIG. 17 illustrates the device of FIG. 16 engaged with an embodiment of a connector body.

It may also be appreciated that in some embodiments, at least one electrical contact 14 of the connector 10 is angled so as to contact only a portion of corresponding receiving contact 16 on a device 12 or to contact a particular receiving contact 16 within a notch 50 on a device 12. For example, an electrical contact 14 may be comprised of a wire that is curved or angled so as to contact only a top corner edge or a bottom corner edge of a notch 50 on side-edge surface 18. FIG. 16 illustrates a device 12 having a plurality of notches 50 along a side-edge surface 18, each notch 50 including a plurality of receiving contacts (e.g. a first receiving contact 16' and a second receiving contact 16" stacked with a non-electrically conductive layer, such as a dielectric layer, therebetween). FIG. 17 illustrates the device 12 of FIG. 16 engaged with a connector body 11. Here, an alignment receptacle 20 on the device 12 is engaged with an alignment structure 22 on the connector body 11 so that the side-edge surface 18 is aligned with the plurality of electrical contacts 14 along the connector body 11. FIG. 17 provides a cut-away side view illustration of the engagement, wherein the electrical contact 14 is configured to contact the first receiving contact 16' and not the second receiving contact 16". This may provide a variety of attributes. To begin, such arrangement may allow varied orientation of the device 12. For example, if proper orientation of the device 12 is such that the first receiving contact 16' is on the top, such engagement may provide a desired connection, such as a desired transmission of signals. However, if the device 12 is inverted such the second receiving contact 16" is on top, such engagement may provide an undesired connection, such as no transmission of signals or a signal that indicates improper orientation. Another attribute is the ability to provide different transmission signals based on the orientation of the device 12. For example, if the device 12 is engaged so that the first receiving contact 16' is in contact with the electrical contact 14 a first set of signals is transmitted. And, if the device 12 is inverted and engaged so that the second receiving contact 16" is in contact with the electrical contact 14 a second set of signals is transmitted. In some embodiments, the second set of signals comprises an inverse of the first set of signals. In this regard, the connector 10 sees the same signals regardless of the orientation of the device 12.

In other embodiments, the device 12 comprises a plurality of notches 50 along a side-edge surface 18, each notch 50 including a first ground, a middle receiving contact 16 and a second ground, wherein the middle receiving contact 16 is insulated between the first and second ground layers. In this embodiment, the electrical contact 14 engages the middle receiving contact 16 and transmits a high-speed signal. In some embodiments, the electrical contact 14 comprises a co-axial type of spring pin. In other embodiments, the electrical contact 14 transmits microwave signals, RF signals or other signals.

It may be appreciated that the electrical contacts 14 on the connector body 11 and the receiving contacts 16 on the side-edge surface 18 of the device 12 may take a variety of alternative forms. For example, one or both of the contacts 14, 16 may comprise an elastomeric connector, such as a ZEBRA® connector. Some elastomeric connectors are comprised of alternating conductive and insulating regions in a rubber or elastomer matrix to produce overall anisotropic conductive properties. In some embodiments, the elastomeric connector is comprised of alternating conductive and insulating layers of silicone rubber, cut crosswise to expose the thin layers. Thus, they provide high-density redundant electrical paths for high reliability connections. In some embodiments, an array of receiving contacts within a castellated notch 50 are connected by an elastomer strip.

In some embodiments, the device 12, such as a PCB, includes receiving contacts 16 that comprise an array of signal pads that contact an X,Y array of electrical contacts on the connector body 11 (which can comprise an elastomer strip) so as to create a checkerboard of contacts. In some embodiments, the elastomer strip comprises layers of electrically conductive material sandwiched between layers of insulator (i.e., non-electrically conductive material) at typically three times the pitch of the target contacts. This ensures a non-precisely placed contact strip has at least one connection to a similar mating contact strip at the other end of the elastomer. In some embodiments, special marker signals on the PCB (e.g. grounds, or power) can connect imprecisely to a larger set of receiving contact pads on the probe PCB. Smart electronics and an analog switch array can identify where the marker signals are and switch the signal on the target to the corresponding outputs on the probe PCB. This allows imprecise positioning at higher density of signals for factory test, by relying on the smart electronics to identify the marker signals and extrapolate the other signal positions in the array of signal pads and use the analog switch array to connect them to the right place. This could be as small as a chip scale or much larger IC pin scale, but preferably would be multiple contacts in X,Y positions on the side-edge of the PCB.

It may also be appreciated that the connector body 11 may include any number of electrical contacts 14 and the device 12 typically includes at least as many receiving contacts 16 as electrical contacts 14. In some embodiments, the connector 11 has a subset of electrical contacts 14 that are used for factory programming, debugging, testing, etc. Thus, in these embodiments the connector 11 may have more contacts 14 than are utilized for advanced debugging in development (such as trace).

It may be appreciated that the device 12 may have a variety of sizes and shapes, including rectangular, square, round, oval or polygonal. Thus, the side-edge surface 18 of the device 12 may be flat, curved or a combination of these. For more examples, the side-edge surface 18 of the device 12 may have a square wave, sawtooth or sinusoidal shape. These are just a few examples that are not intended to be all encompassing or exhaustive.

It may also be appreciated that the connector body 11 may have a variety of sizes and shapes, including rectangular, square, round, oval or polygonal. More generally, the size and shape of the connector body 11 may depend on the size and shape of the device 12 to which the connector body 11 is intended to mate or connect. In some embodiments, the connector body 11 has a rectangular shape approximately 1.25 inches long and 1 inch wide. Such sizing may be suitable for providing fourteen electrical contacts 14. It may be appreciated that at least the width may vary to accommodate different numbers of electrical contacts 14. Typically, the connector body 11 is thin, and in some embodiments sufficiently thin to connect to the edges of PCBs that are stacked in layers. In some instances, the distance between PCBs in a stacked configuration is 1-2 mm, however a spacing of 8-15 mm is more typical. It may be appreciated that the mating area 34 may also have a variety of configurations. The mating area 34 is configured to easily secure the connector body 11 to the device 12, to maintain a desired spatial relationship between the connector body 11 and the device 12, to allow for easy removal of the connector body 11 from the device 12 and to provide a secure and stable connection between the connector body 11 and the device 12. Thus, the mating area 34 may likewise be flat, curved or a combination of these.

Figure 18:
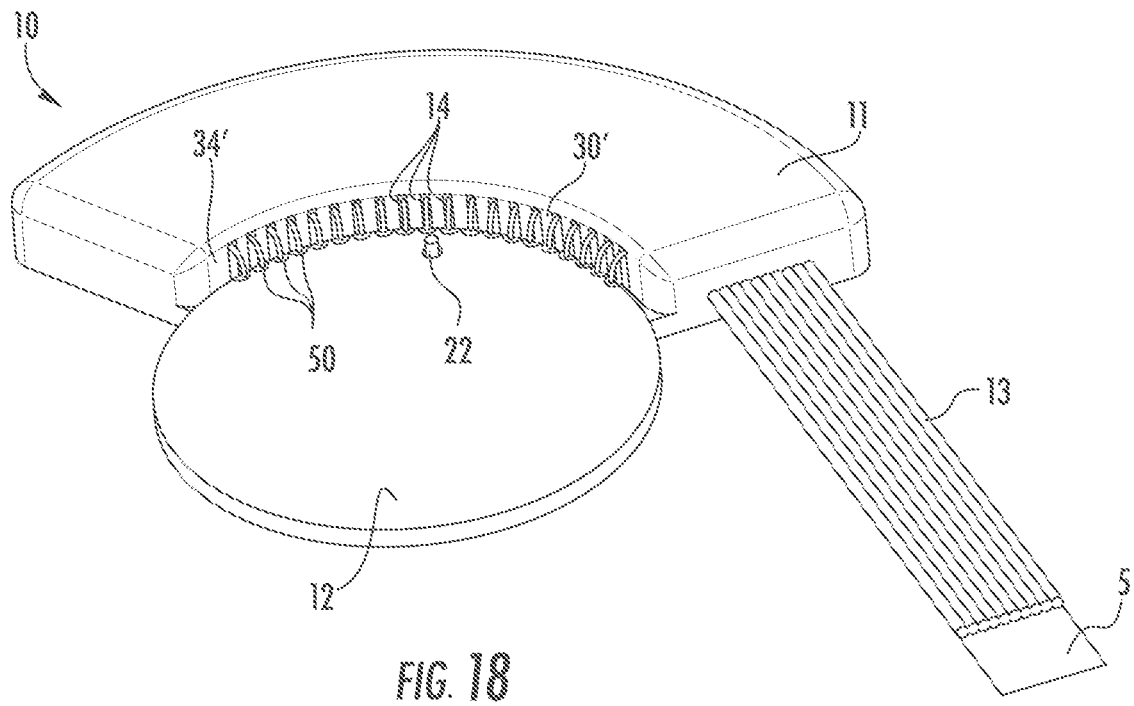
FIG. 18 illustrates an embodiment of a device, such as a PCB, having a round shape mated with a compatibly shaped connector.

It may be appreciated that a variety of popular electronic components are round or disc shaped, such as circular Bluetooth™ IoT products like trackers and beacons. These products are often circular and are at times generally the size of a coin cell battery. Likewise, such products may include internal components which are correspondingly round. FIG. 18 illustrates an embodiment of a device 12, such as a PCB, having a round shape mated with a compatibly shaped connector 10. Here, the connector body 11 has a corresponding arc shape wherein a plurality of electrical contacts 14 is aligned along a curved inner edge 30' of the body 11. The curved inner edge 30' is set in from a parallel curved outer edge 32" (not shown as it is covered by the device 12) forming a curved mating region 34' having a step shape. The curved mating region 34' is the area along the connector body 11 which receives portions of the device 12 during connection. In this embodiment, each electrical contact 14 is disposed in a respective individual slot 33 along the curved inner edge 30' of the connector body 11 and each electrical contact 14 has a rounded or bowed shape extending outward through its respective slot 33, extending beyond the curved inner edge 30 of the connector body 11 and over the top surface of the receiving platform 36. This embodiment also includes an alignment structure 22 which passes through an alignment receptacle 20 on the device 12. It may be appreciated that the connector body 11 may be shaped to correspond to any odd shaped device 12 outline.

Figure 19:
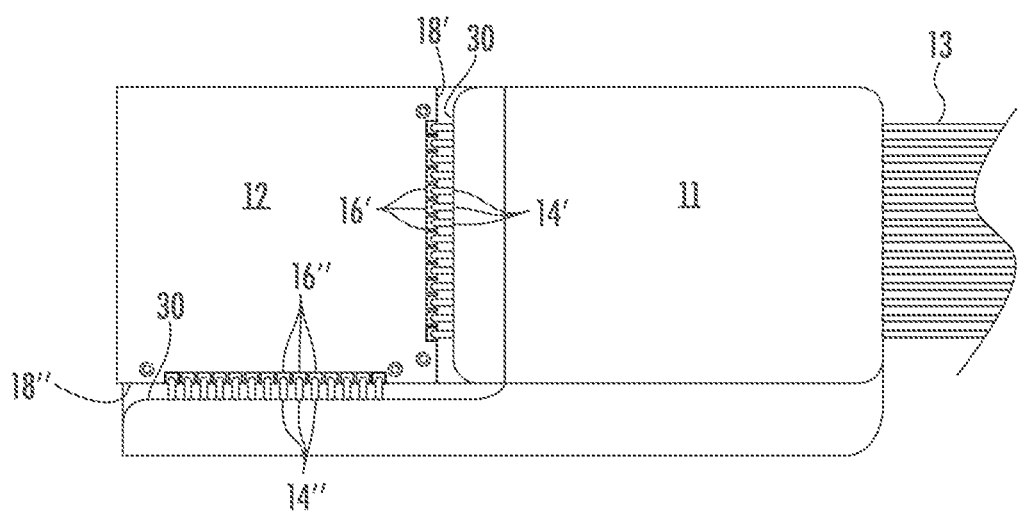
FIG. 19 illustrates a connector body configured to engage two side-edge surfaces of a device simultaneously.

In some embodiments, the device 12 includes receiving contacts 16 along more than one side-edge surface 18. For example, devices 12 having a rectangular or square shape have four side-edge surfaces 18 wherein receiving contacts 16 may be disposed along any or all of the four side-edge surfaces 18. In such instances, the connector 10 may have a connector body 11 configured so as to mate electrical contacts 14 with receiving contacts 16 on more than one side-edge surface 18 simultaneously. FIG. 19 illustrates a connector body 11 configured to engage two side-edge surfaces 18 of a device 12 simultaneously. In this embodiment, the connector body 11 includes a first set of electrical contacts 14' configured to engage a first set of receiving contacts 16' along a first side-edge surface 18'. And, the connector body 11 includes a second set of electrical contacts 14" configured to engage a second set of receiving contacts 16" along a second side-edge surface 18". It may be appreciated that two, three, four or more side-edge surfaces may be engaged simultaneously and the side-edge surfaces may be or may not be next to each other. This may allow more signals to be delivered to device 12 at a given time, allowing for smaller devices. It may be appreciated that simultaneous engagement may inherently provide alignment, therefore in such instances alignment structures may not be present or utilized.

It may also be appreciated that a device 12 having receiving contacts 16 along more than one side-edge surface 18 may be connected with more than one connector body 11 simultaneously. The more than one connector bodies 11 may be part of the same connector 10 or may be parts of separate connectors 10.

Figure 20:
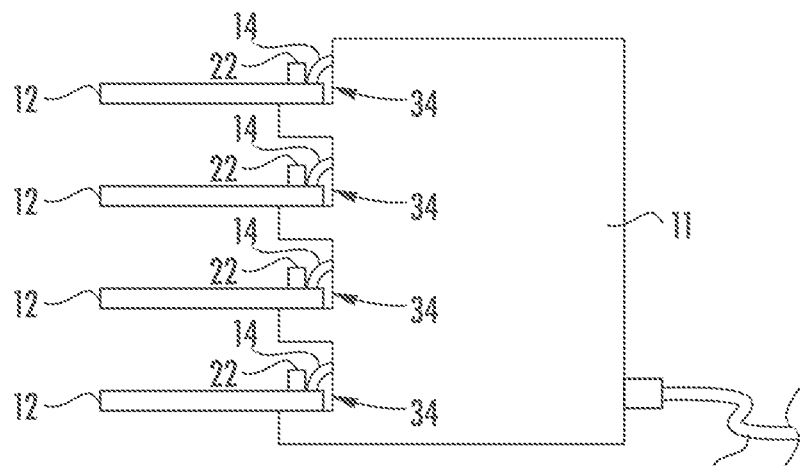
FIG. 20 illustrates a connector having a plurality of mating areas stacked vertically along a wall of the connector body.

As mentioned, in some embodiments the connector body 11 includes more than one mating areas 34. In some instances, the more than one mating areas 34 are disposed along the different sides or walls of the connector body 11, such as illustrated in FIG. 19. In other embodiments, the two or more mating areas 34 are disposed along the same side or wall of the connector body 11. For example, FIG. 20 illustrates a connector 10 having a plurality of mating areas 34 stacked vertically along a wall of the connector body 11. In this embodiment, four mating areas 34 are present, each mating area 34 having a plurality of electrical contacts 14 aligned along an inner edge 30 of the body 11, wherein the inner edge 30 is set in from a parallel outer edge 32 (covered by the device 12 in FIG. 19) forming a mating region 34 having a step shape. As mentioned previously, the mating region 34 is the area along the connector body 11 which receives portions of the device 12 during connection. Thus, in this embodiment, the connector body 11 is able to engage with up to four devices 12 simultaneously. This may be particularly useful when accessing stacked PCBs. Stacked PCBs can be difficult to access, particularly when accessing a particular board within the stack. Engagement of a multitiered connector body 11 (having a mating area 34 on each tier) with PCBs in a stacked configuration enables strong and stable engagement due to the engagement of multiple alignment structures 22 and receptacles 20. In addition, any or all of the engaged devices 12 may be accessed. Therefore, if only a single board is desired to be accessed, in some embodiments signals can be sent to that single board individually of the other boards.

Figure 21:
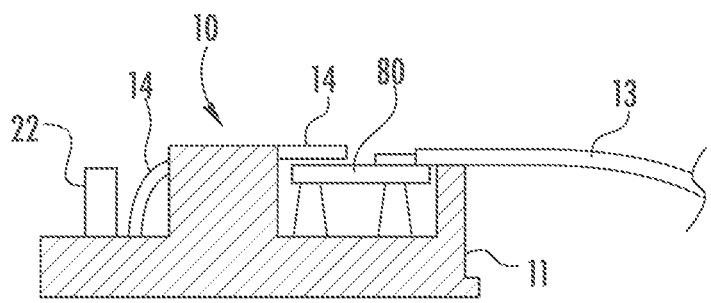
FIG. 21 provides a simplified cross-sectional side view of an embodiment of a connector including electronics within the connector body.
Figure 22:
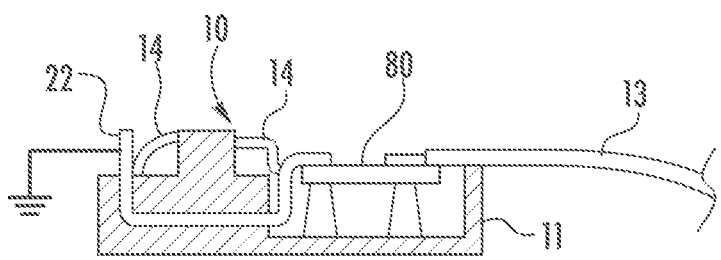
FIG. 22 illustrates an embodiment of a connector wherein the alignment structure comprises a pin acting as a grounding pin.

As described herein above, the connectors 10 of the present invention are provided for making a temporary or permanent connection to a device 12 to program, configure, debug, test, monitor, inspect or set some state(s) of the electronic device 12, among other functions. Thus, the connector 10 typically includes electronics to enable these functions. One or more portions of such electronics to enable these functions can be included in another device (e.g., the other device 21 in FIG. 2) to which the connector 12 may be connected via a cable 13. FIG. 21 provides a simplified cross-sectional side view of an embodiment of a connector 10 including electronics within the connector body 11. In this embodiment, the electronics comprise a printed circuit board 80 which is electrically connected with each electrical contact 14. In particular, in this embodiment each electrical contact is soldered to the board 80. In addition, the printed circuit board 80 is electrically connected, such as soldered, to a cable 13 which exits the connector body 11. In this embodiment, the cable 13 leads to an adapter 5 (not shown). FIG. 22 illustrates a similar embodiment wherein the alignment structure 22 comprises a pin acting as a grounding pin. This grounding pin extends within the connector body 11, such as shown, to an electrical ground on the board 80. Use of a grounding pin in addition to a power pin may allow a safe hot-connection to avoid issues such as latch-up.

Figure 23:
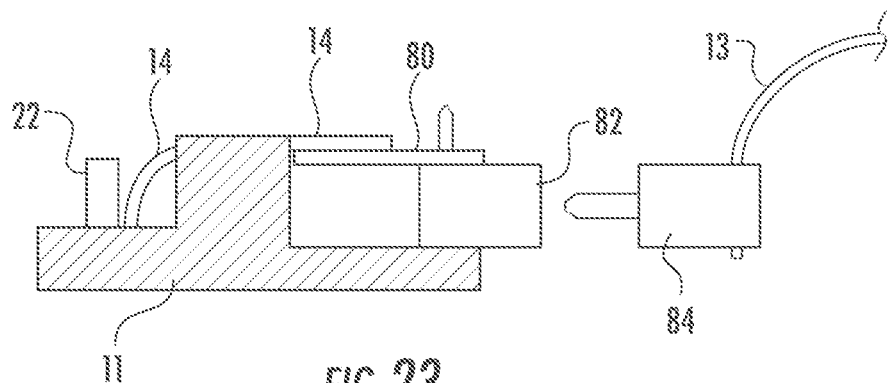
FIG. 23 illustrates an embodiment of a connector wherein the electronics comprise a printed circuit board which is electrically connected with each electrical contact.

FIG. 23 illustrates another embodiment wherein the electronics comprise a printed circuit board 80 which is electrically connected with each electrical contact 14. However, in this embodiment, a header 82 is electrically connected with the board 80 wherein the header 82 is configured to receive a cable 13. Thus, the cable 13 includes an attachment 84 which connects with the header 82 to create the electrical connection.

Figure 24:
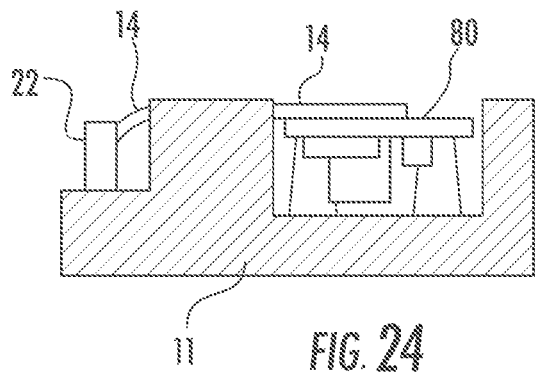
FIG. 24 illustrates another embodiment of a connector wherein the electronics comprise a printed circuit board which is electrically connected with each electrical contact.

FIG. 24 illustrates another embodiment wherein the electronics comprise a printed circuit board 80 which is electrically connected with each electrical contact 14. In this embodiment, the printed circuit board 80 includes electronic circuitry 15 which communicates with the electrical contacts 14 without the presence of an external device.

Figure 25:
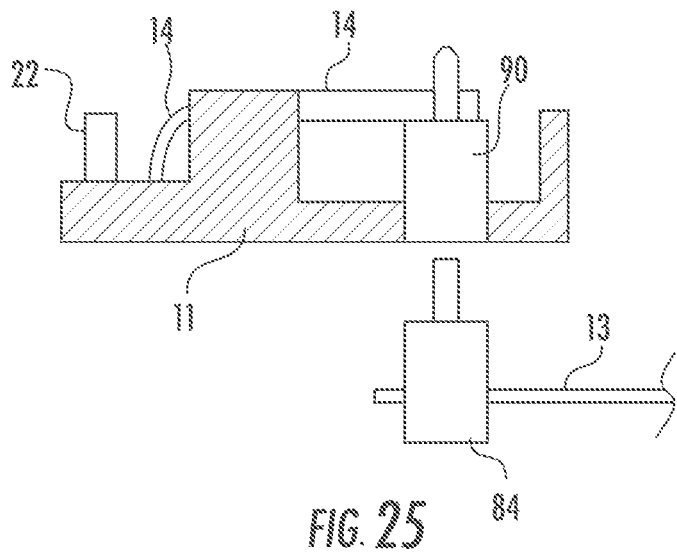
FIG. 25 illustrates an embodiment of a connector wherein each electrical contact is electrically connected to an insulation-displacement contact (IDC) connector rather than a printed circuit board.

FIG. 25 illustrates an embodiment wherein each electrical contact 14 is electrically connected to an insulation-displacement contact (IDC) connector 90 rather than a printed circuit board. The IDC connector 90 is configured to receive a cable 13. Thus, the cable 13 includes an attachment 84 which connects with the IDC connector to create the electrical connection.

In some embodiments, the electronic circuitry 15 has custom electronics for driving signals, for programming firmware or for wirelessly communicating with a monitoring/controlling device. Relatively fast programming/configuration signals are typically sent down a ribbon cable of several inches or even meters. These signals often are not "driven" so they are not intended for use at a significant distance, and speed of operation and data integrity can be affected. When field-programmable gate arrays (FPGA) are used, very large configuration files may need to be programmed or loaded into the device 12 and this can take a long time over traditional JTAG signals (several minutes). When the connector 10 has a high-speed interface, such as ethernet or USB connect, to its PCB and the PCB has a driver circuit to drive the signals at high speed, the data integrity and speed and distance from the target device can all be improved. Consequently, instead of the equipment being inches away, it could be feet or miles. Other smart electronics would be present for use with a wirelessly connected JTAG programmer/debugger. This has advantages of perfect electrical isolations for safety and also for preventing ground loops and signal integrity issues that are introduced with extra connections within a system or with long wires picking up electrical noise. It may be appreciated that in some embodiments, the custom electronics of the connector 10 includes wireless electronics (such as WiFi electronics, Bluetooth electronics, or Infrared electronics), electronics to automatically program a target microcontroller unit (MCU), datalogging electronics, signal drivers, device programming electronics (e.g. USB Host to JTAG or serial or parallel format), to name a few.

In some embodiments, the connector 10 attaches to more than one device 12 at the same time, so as to perform these actions on the multiple devices 12 simultaneously (i.e., in parallel), in series, or in a sequence pattern, to name a few. In preferred embodiments, the connection is temporary, wherein the connector 10 is removable from the device 12, such as when not in use. This allows the device 12 to be accessed as needed without the disadvantages associated with surface mounted connectors. In particular, such removability eliminates any need for dedicated connector space on the device which is increasingly scarce in regard to printed circuit boards which are reducing in size and have limited space. In addition, the lack of surface mounting also allows connection to various types and configurations of devices 12 which are not possible with conventional connectors. One example, described previously in relation to FIG. 20, is stacked devices 12. Engagement of a multi-tiered connector body 11 (having a mating area 34 on each tier) with devices 12, such as PCBs, in a stacked configuration enables strong and stable engagement due to the engagement of multiple alignment structures 22 and receptacles 20. In some embodiments, the multi-tiered connector body 11 includes stacking hardware compatible with the devices 12. Currently, conventional stacked boards are achieved with either a connector on top of the bottom board plugging into a mating connector on the above board, or by a connector that is soldered to one and has spring-pin contacts that contact pads or a mating ball-socket component on the bottom of the board above. There are also often mechanical supports or spacers in addition to the connectors. A multi-tiered connector of the present invention could provide both the support for the stack of boards and the connections between boards while taking up almost zero board space both for the contacts and the board supports.

Figure 26:
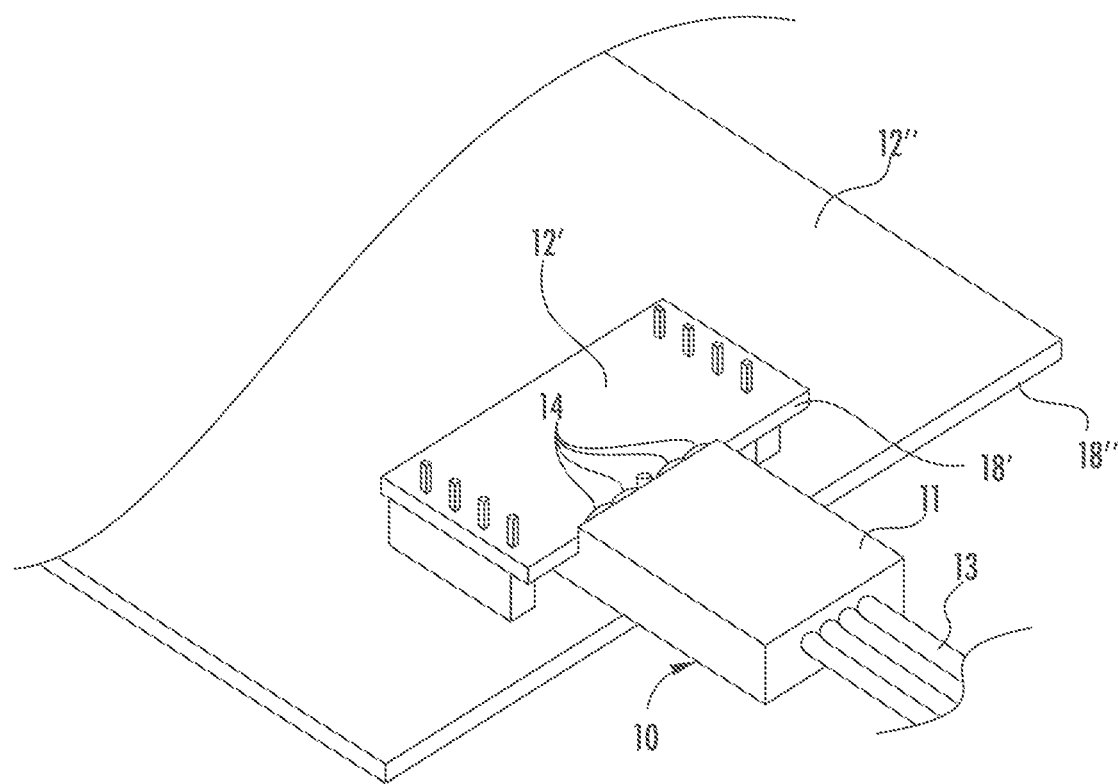
FIG. 26 illustrates an embodiment of a connector mated with a smaller device mounted on a larger device.

Another example, illustrated in FIG. 26, is a smaller device 12' mounted on a larger device 12". Such arrangement of devices 12', 12" is similar to stacked devices 12 in that one is positioned over or above the other. Typically, such an arrangement would cause difficulty in accessing the smaller device 12' however embodiments of connectors 10 of the present invention are configured to removably attach to such devices 12', such as illustrated in FIG. 26. As shown, receiving contacts 16 along a side-edge surface of the device 12' mate with the electrical contacts 14 disposed along an edge of the connector body 11. This allows a connection to, for example, program, configure, monitor, inspect or set some state(s) of the device 12'. It may be appreciated that in some embodiments, the connector body 11 is configured to mate with the smaller device 12' and the larger device 12" simultaneously, such as when their respective side-edges 18', 18" are aligned.

Figure 27:
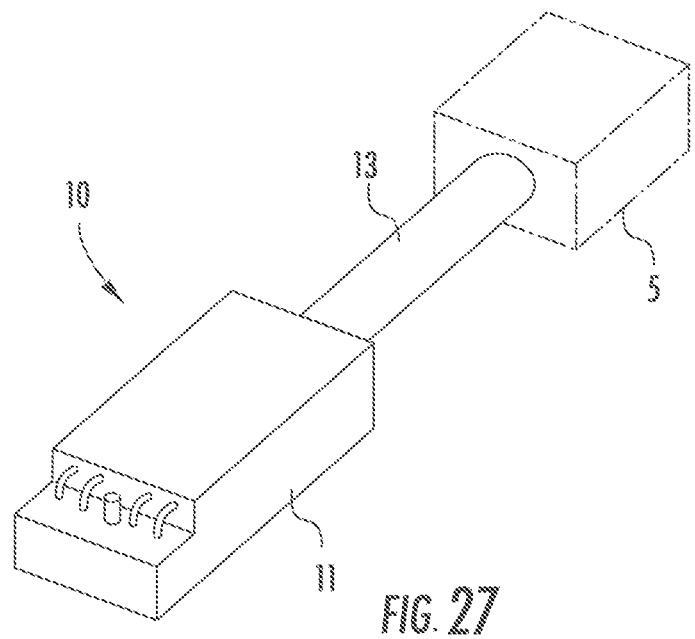
FIG. 27 is a representative illustration of a connector body attached to an adapter by a cable.
Figure 28:
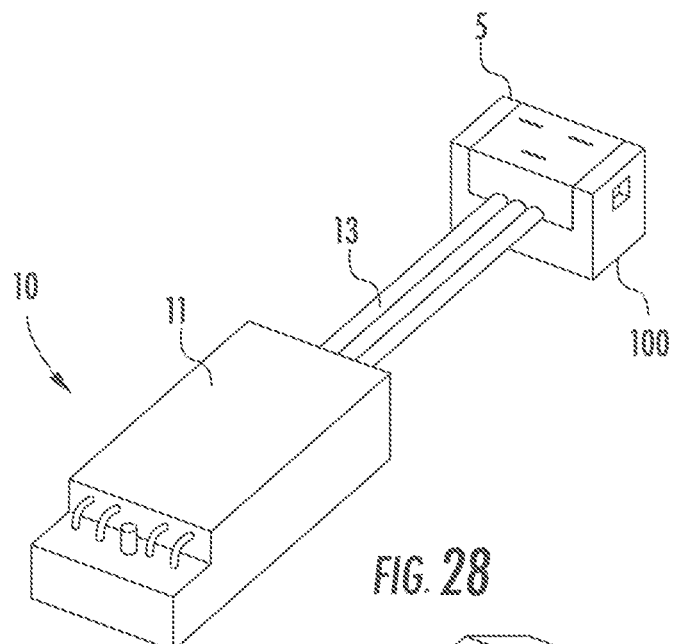
FIGS. 28-30 illustrate example embodiments of adapters associated with connector bodies.
Figure 29:
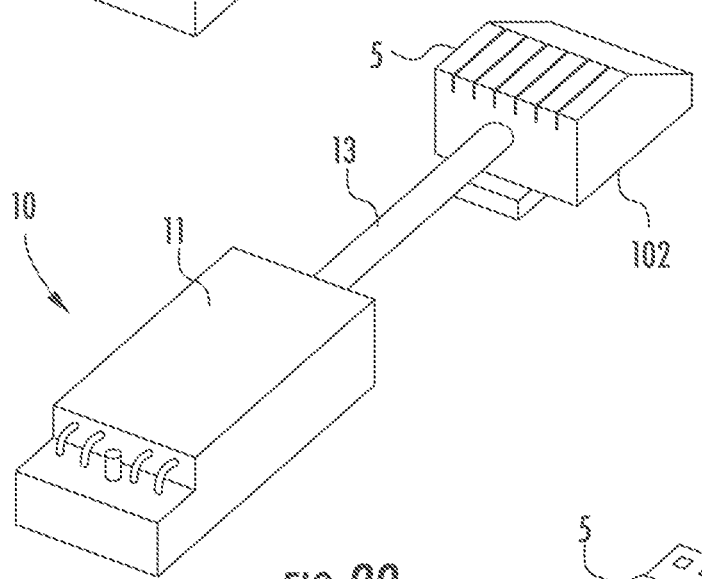
Figure 30:
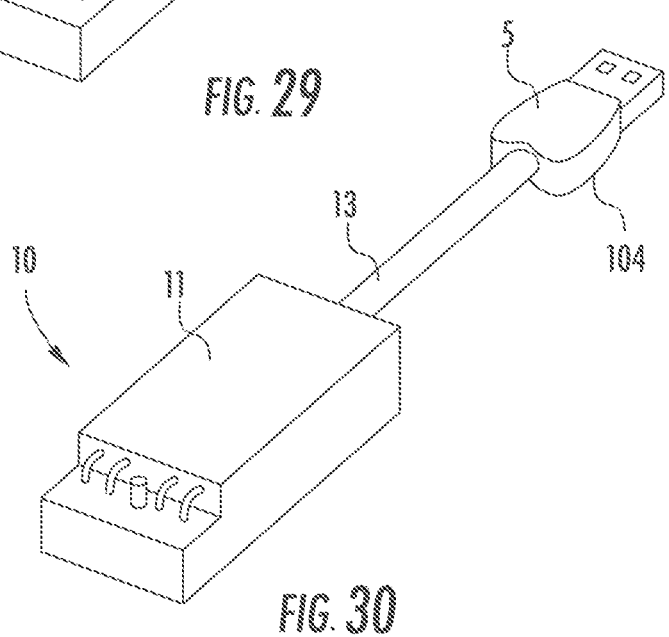

As mentioned previously, in some embodiments, the connector 10 can also include an adapter 5 for electrical connection with another device 21 (e.g., as shown in FIG. 2). It may be appreciated that the adapter 5 may be configured to physically connect with the other device 21 to make the electrical connection (as illustrated in FIG. 2), or the adapter 5 may be configured to provide wireless electrical connection with the other device 21. Also mentioned previously, the adapter 5 may be connected to the connector body 11 by a cable 13 or similar device. FIG. 27 is a representative illustration of connector body 11 attached to an adapter 5 by a cable 13. FIGS. 28-30 illustrate example embodiments of adapters 5. In particular, FIG. 28 illustrates an embodiment of an adapter 5 comprising an IDC wire-to board connector 100. FIG. 29 illustrates an embodiment of an adapter 5 comprising a male ethernet type adapter 102, such as in RJ45 or similar connector. FIG. 30 illustrates an embodiment of an adapter 5 comprising a male USB A-type connector 104.

In each of the above described embodiments, the connector body 11 can include electronic circuitry 15. While the connector body 11 is in engagement with a side-edge surface 18 of a device 12 (e.g., a printed circuit board), the electronic circuitry 15 (included in the connector body 11) may allow for transmission of electronic signals between at least one electrical contact of the connector body 11 and another device (e.g., the other device 21 in FIG. 2) that is used for, for example, programming, debugging, configuring, monitoring, or testing of the device 12 to which the connector body 11 is engaged. Such electronic circuitry 15 can solely include one or more electrically conductive paths (e.g., traces and/or wires) that simply provide one or more electrical pathways for one or more electrical signals. Additionally, such electronic circuitry 15 can include one or more passive and/or active electrical components. Exemplary passive electrical components include resistors, capacitors, and inductors. Exemplary active electrical components include transistors and diodes. As was explained above, the connector body 11 can be connected to the other device 21 via a cable 13 and an adapter 5 (e.g., as shown in FIG. 2), or using an adapter 5 included in the connector body (e.g., as shown in FIGS. 3A and 3B). Alternatively, the electronic circuitry 15 included in the connector body 11 can include wireless communication circuitry that enables the connector body 11 to communicate wirelessly with another device (e.g., the other device 21), without the need for a cable 13 and (wherein the adapter 5 as the form of a wireless transceiver).

It may be appreciated that elements and features of the connector body 11 may be assembled or affixed to each other by a variety of means including over molding, soldering, crimping, riveting, casting, extruding, stamping, adhering, or putting in place. Likewise, it may be appreciated that elements and features of the device 12 may be assembled or affixed to each other by a variety of means including over molding, soldering, crimping, riveting, casting, extruding, stamping, adhering, or putting in place. The entire connector body 11 and/or device 12 may be a single formed or fabricated component, or features formed from separate components may be formed from one or more common components.

It may also be appreciated that the electrical contacts 14 may be disposed along any suitable surface of the connector body 11, including an outer edge of the connector body 11 rather than inner edge 30. Thus, the electrical contacts 14 may be disposed along any suitable surface of the connector body 11 which allows connection with receiving contacts 16 along a side-edge surface 18 of the device 12.

It may also be appreciated that the electrical contacts 14 may take a variety of forms. For example, in some embodiments each electrical contact 14 comprises a straight pin, such as a spring-pin. Each straight pin has a tip which contacts a receiving contact 16 on the side-edge surface 18 of the device 12. Thus, the spring force pushing the pins against the receiving contacts 16 provide sufficient friction to ensure engagement. In other embodiments, each electrical contact 14 comprises a metal rod. In such embodiments, the receiving contacts 16 on the side-edge surface 18 of the device 12 comprise plated holes. Thus, each metal rod extends into a plated hole to ensure engagement.

It may also be appreciated that alignment features (i.e., alignment structures 22, alignment receptacles 20) other than pins and holes may be used, such as magnets, suction cups, adhesives, clips, static electricity, springs, compressible materials, or other mechanisms either separately or in combination. Likewise, alignment structures 22, such as pins, may alternatively be received by indents or recesses so that the alignment structures 22 do not pass through the device 12. It may also be appreciated that in some embodiments the connector body 11 may not include alignment structures or may rely on other structures or features to dually serve as alignment structures.

It may be appreciated that the connector 10 may include a variety of combinations of features and aspects and may not include all aspects in all embodiments. For example, in some embodiments, the connector body 11 does not include slots 33, includes slots 33 of uneven spacing, includes slots 33 of varying sizes, does not include grooves 40, includes grooves 40 of uneven spacing, includes grooves 40 of varying sizes, includes electrical contacts 14 of varying number, size and configuration, etc.

It may be appreciated that devices 12 may be comprised of components other than printed circuit boards, such as flex circuits, chip on glass, hybrid and ceramic boards, optical circuits, and/or other devices. It may be appreciated that the device 12 may refer to any such device, platform, object, board, or thing that is used to receive the connector 10. In certain embodiments, the devices 12 may not be electrical or optical in nature, but may be electromagnetic. In certain embodiments, the devices 12 used rather than being a printed circuit board may be structural (e.g. part of a building, furniture, machinery, tool, or equipment), textile, paper or plastic, or otherwise primarily mechanical or aesthetic in nature. Devices 12 may be raw or partially processed components of an assembly or fabrication process.

While preferred embodiments of the present invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. A connector for temporary communication between programmable or configurable electronics of a printed circuit board and an external electronic device, the connector comprising:
   a connector body having a mating region configured to engage a side-edge surface of the printed circuit board, wherein the side-edge surface comprises at least one receiving contact electrically connected to the programmable or configurable electronics, and wherein the mating region includes at least one electrical contact protruding outwardly from the mating region so that each of the at least one electrical contact removably engages a corresponding receiving contact of the at least one receiving contact disposed along the side-edge surface of the printed circuit board during the temporary communication and is configured to disengage the corresponding receiving contact upon removal after the temporary communication;
   an adapter configured to physically connect with a connector of the external electronic device so as to receive electrical signals from the external electronic device for at least one of programming, debugging, configuring, monitoring, testing or state configuring the programmable or configurable electronics of the printed circuit board during the temporary communication; and
   electronic connections electrically connecting the at least one electrical contact with the adapter so as to allow the electronic signals to pass from the external electronic device to the programmable or configurable electronics of the printed circuit board during the temporary communication so as to accomplish at least one of programming, debugging, configuring, monitoring, testing, or state configuring of the printed circuit board.

2. A connector as in claim 1, further comprising at least one alignment feature configured to ensure alignment of the printed circuit board with the mating region of the connector body so that each of the at least one electrical contact engages the corresponding receiving contact disposed along the side-edge surface of the printed circuit board.

3. A connector as in claim 2, wherein the at least one alignment feature comprises an alignment structure which engages an alignment receptacle in or on the printed circuit board.

4. A connector as in claim 3, wherein the at least one alignment structure comprises a pin and the alignment receptacle comprises a hole, wherein the pin passes through the hole.

5. A connector as in claim 3, wherein the at least one alignment structure comprises a protrusion and the alignment receptacle comprises an indent, wherein the protrusion mates with the indent.

6. A connector as in claim 1, wherein the mating region comprises a receiving platform for receiving a broad planar surface of the printed circuit board adjacent to the side-edge surface while each of the at least one electrical contact engages its corresponding receiving contact.

7. A connector as in claim 6, wherein the receiving platform is disposed between an outer edge of the connector body and an inner edge surface of the connector body so as to form a step shape, wherein the at least one electrical contact comprises a plurality of electrical contacts aligned in a row along the inner edge surface and extending outwardly from the inner edge surface over at least a portion of the receiving platform.

8. A connector as in claim 7, wherein each of the at least one electrical contact comprises a wire which curves downward toward the receiving platform so that a curved portion of the wire is able to contact the corresponding receiving contact.

9. A connector as in claim 8, wherein the side-edge surface of the printed circuit board includes a series of notches and within each of the notches is disposed at least one of the at least one receiving contact, and wherein each of the curved portions is configured to extend into a corresponding one of the notches to engage the receiving contact therein.

10. A connector as in claim 8, wherein the side-edge surface of the printed circuit board includes a series of notches and within each of the notches is disposed at least two of the at least one receiving contacts, and wherein each of the curved portions is configured to extend into a corresponding one of the notches to engage only one of the two receiving contacts therein.

11. A connector as in claim 8, wherein the inner edge surface includes a series of slots aligned with the plurality of electrical contacts wherein the wire of each of the plurality of electrical contacts emerges from a corresponding slot prior to curving downward toward the receiving platform, and wherein portions of the inner edge surface between each slot in the series of slots electrically isolate each of the plurality of electrical contacts from each other.

12. A connector as in claim 11, wherein the receiving platform includes a plurality of grooves aligned with the series of slots, each groove configured to receive the curved portion of each of the plurality of electrical contacts so as to assist in maintaining separation and stability of the plurality of electrical contacts.

13. A connector as in claim 1, wherein the connector body comprises an additional mating region configured to engage a side-edge surface of an additional printed circuit board, wherein the additional mating region includes an additional at least one electrical contact protruding outwardly from the additional mating region so that each of the additional at least one electrical contact engages a corresponding receiving contact disposed along a side-edge surface of the additional printed circuit board when engaged with the additional mating region.

14. A connector as in claim 13, wherein the mating region and the additional mating region are disposed in parallel with each other along a side of the connector body and wherein the mating region and the additional mating region are spaced apart so as to allow simultaneous engagement with the printed circuit board and the additional printed circuit board when in a stacked configuration.

15. A connector as in claim 13, wherein the mating region and the additional mating region are disposed on different sides of the connector body and allow simultaneous engagement with the printed circuit board and the additional printed circuit board.

16. A method of temporarily accessing a printed circuit board for transmitting electronic signals between the printed circuit board and an external device, the method comprising:
aligning a connector with the printed circuit board, wherein
the connector has at least one electrical contact protruding outwardly from a surface of a connector body and electronic connections within the connector body electrically connected with the at least one electrical contact, and
the printed circuit board has at least one side-edge surface having at least one receiving contact disposed thereon; and
removably mating the connector with the printed circuit board so that each of the at least one electrical contact removably engages one of the at least one receiving contact so as to allow transmission of electronic signals between the electronic connections and the printed circuit board for at least one of programming, debugging, configuring, monitoring, testing, or state configuring of the printed circuit board,
wherein the connector has an adapter configured to electrically connect with the external device, and wherein the method further comprises electrically connecting the adapter with the external device and transmitting electrical signals between the printed circuit board and the external device through the mated at least one electrical contact and the at least one receiving contact.

17. The method of claim 16, wherein transmitting electrical signals comprises forming a programming, debugging, configuring, monitoring, testing, state configuring connection between the printed circuit board and the external device.

18. The method of claim 16, wherein electrically connecting the adapter to the external device comprises mechanically connecting the external device with the adapter to form an electrical connection.

19. The method of claim 16, further comprising disengaging the mated at least one electrical contact with the at least one receiving contact and removing the connector from the printed circuit board after transmission of the electronic signals between the electronic connections and the printed circuit board for the at least one of programming, debugging, configuring, monitoring, testing, or state configuring of the printed circuit board.

20. The method of claim 16, wherein aligning comprises aligning an alignment structure on the connector with an alignment receptacle in or on the printed circuit board.

21. The method of claim 20, wherein the alignment structure comprises a pin and the alignment receptacle comprises a hole, and wherein mating comprises passing the pin through the hole.

22. A connector for temporarily accessing a printed circuit board for electrical communication with the printed circuit board, the connector comprising:
a connector body having a mating region configured to engage a side-edge surface of the printed circuit board, wherein the mating region includes at least one electrical contact protruding outwardly from the mating region so that each of the at least one electrical contact engages a corresponding receiving contact disposed along the side-edge surface of the printed circuit board when engaged with the mating region; and
electronic connections within the connector body electrically connected with the at least one electrical contact so as to allow at least one of programming, debugging, configuring, monitoring, testing, or state configuring connection of the printed circuit board,
wherein the mating region comprises a receiving platform for receiving a broad planar surface of the printed circuit board adjacent to the side-edge surface while each of the at least one electrical contact engages its corresponding receiving contact,
wherein the receiving platform is disposed between an outer edge of the connector body and an inner edge surface of the connector body so as to form a step shape, wherein the at least one electrical contact comprises a plurality of electrical contacts aligned in a row along the inner edge surface and extending outwardly from the inner edge surface over at least a portion of the receiving platform,
wherein each of the at least one electrical contact comprises a wire which curves downward toward the receiving platform so that a curved portion of the wire is able to contact the corresponding receiving contact,
wherein the side-edge surface of the printed circuit board includes a series of notches and within each of the notches is disposed at least two of the at least one receiving contacts, and
wherein each of the curved portions of the wire of each of the at least one electrical contact is configured to extend into a corresponding one of the notches to engage only one of the two receiving contacts therein.

23. A connector for temporarily accessing a printed circuit board for electrical communication with the printed circuit board, the connector comprising:
a connector body having a mating region configured to engage a side-edge surface of the printed circuit board, wherein the mating region includes at least one electrical contact protruding outwardly from the mating region so that each of the at least one electrical contact engages a corresponding receiving contact disposed along the side-edge surface of the printed circuit board when engaged with the mating region; and
electronic connections within the connector body electrically connected with the at least one electrical contact so as to allow at least one of programming, debugging, configuring, monitoring, testing, or state configuring connection of the printed circuit board,
wherein the mating region comprises a receiving platform for receiving a broad planar surface of the printed circuit board adjacent to the side-edge surface while each of the at least one electrical contact engages the corresponding receiving contact,
wherein the receiving platform is disposed between an outer edge of the connector body and an inner edge surface of the connector body so as to form a step shape,
wherein the at least one electrical contact comprises a plurality of electrical contacts aligned in a row along the inner edge surface and extending outwardly from the inner edge surface over at least a portion of the receiving platform,
wherein each of the at least one electrical contact comprises a wire which curves downward toward the receiving platform so that a curved portion of the wire is able to contact the corresponding receiving contact,
wherein the inner edge surface includes a series of slots aligned with the plurality of electrical contacts wherein the wire of each of the plurality of electrical contacts emerges from a corresponding slot prior to curving downward toward the receiving platform, and wherein portions of the inner edge surface between each slot in the series of slots electrically isolate each of the plurality of electrical contacts from each other, and
wherein the receiving platform includes a plurality of grooves aligned with the series of slots, each of the plurality of grooves is configured to receive the curved portion of a corresponding one of the plurality of electrical contacts so as to assist in maintaining separation and stability of the plurality of electrical contacts.

24. A connector for temporary communication between programmable or configurable electronics of a printed circuit board and an external electronic device, the connector comprising:
a connector body having a mating region configured to engage a side-edge surface of the printed circuit board, wherein the side-edge surface comprises at least one receiving contact electrically connected to the programmable or configurable electronics, and wherein the mating region includes at least one electrical contact protruding outwardly from the mating region so that each of the at least one electrical contact removably engages a corresponding receiving contact of the at least one receiving contact disposed along the side-edge surface of the printed circuit board during the temporary communication and configured to disengage the corresponding receiving contact upon removal after the temporary communication;
an adapter configured to wirelessly connect with the external electronic device so as to receive wireless signals from the external electronic device for at least one of programming, debugging, configuring, monitoring, testing or state configuring the programmable or configurable electronics of the printed circuit board during the temporary communication; and
electronic connections electrically connecting the at least one electrical contact with the adapter so as to allow the wireless signals to pass from the external electronic device to the programmable or configurable electronics of the printed circuit board during the temporary communication so as to accomplish at least one of programming, debugging, configuring, monitoring, testing, or state configuring of the printed circuit board.

25. A connector as in claim 24, further comprising at least one alignment feature configured to ensure alignment of the printed circuit board with the mating region of the connector body so that each of the at least one electrical contact engages the corresponding receiving contact disposed along the side-edge surface of the printed circuit board.

26. A connector as in claim 25, wherein the at least one alignment feature comprises an alignment structure which engages an alignment receptacle in or on the printed circuit board.

27. A connector as in claim 24, wherein the mating region comprises a receiving platform for receiving a broad planar surface of the printed circuit board adjacent to the side-edge surface while each of the at least one electrical contact engages the corresponding receiving contact.

28. A connector as in claim 27, wherein the receiving platform is disposed between an outer edge of the connector body and an inner edge surface of the connector body so as to form a step shape, wherein the at least one electrical contact comprises a plurality of electrical contacts aligned in a row along the inner edge surface and extending outwardly from the inner edge surface over at least a portion of the receiving platform.

29. A connector as in claim 28, wherein each of the at least one electrical contact comprises a wire which curves downward toward the receiving platform so that a curved portion of the wire is able to contact the corresponding receiving contact.

30. A connector as in claim 24, wherein the connector body comprises an additional mating region configured to engage a side-edge surface of an additional printed circuit board, wherein the additional mating region includes an additional at least one electrical contact protruding outwardly from the additional mating region so that each of the additional at least one electrical contact engages a corresponding receiving contact disposed along a side-edge surface of the additional printed circuit board when engaged with the additional mating region.

31. A connector as in claim 30, wherein the mating region and the additional mating region are disposed in parallel with each other along a side of the connector body and wherein the mating region and the additional mating region are spaced apart so as to allow simultaneous engagement with the printed circuit board and the additional printed circuit board when in a stacked configuration.

32. A connector as in claim 30, wherein the mating region and the additional mating region are disposed on different sides of the connector body and allow simultaneous engagement with the printed circuit board and the additional printed circuit board.

33. A connector for temporary communication between programmable or configurable electronics of a printed circuit board and an external electronic device, the connector comprising:
a connector body having a mating region configured to engage a side-edge surface of the printed circuit board, wherein the side-edge surface comprises at least one receiving contact electrically connected to the programmable or configurable electronics, and wherein the mating region includes at least one electrical contact protruding outwardly from the mating region so that each of the at least one electrical contact engages a corresponding receiving contact of the at least one receiving contact disposed along the side-edge surface of the printed circuit board during the temporary communication, and wherein the mating region comprises a receiving platform for receiving a broad planar surface of the printed circuit board adjacent to the side-edge surface while each of the at least one electrical contact engages its corresponding receiving contact;
an adapter configured to physically connect with a connector of the external electronic device so as to receive electrical signals from the external electronic device for at least one of programming, debugging, configuring, monitoring, testing or state configuring the programmable or configurable electronics of the printed circuit board during the temporary communication; and
electronic connections electrically connecting the at least one electrical contact with the adapter so as to allow the electronic signals to pass from the external electronic device to the programmable or configurable electronics of the printed circuit board during the temporary communication so as to accomplish at least one of programming, debugging, configuring, monitoring, testing, or state configuring of the printed circuit board.

34. A connector for temporary communication between programmable or configurable electronics of a printed circuit board and an external electronic device, the connector comprising:
a connector body having a mating region configured to engage a side-edge surface of the printed circuit board, wherein the side-edge surface comprises at least one receiving contact electrically connected to the programmable or configurable electronics, and wherein the mating region includes at least one electrical contact protruding outwardly from the mating region so that each of the at least one electrical contact engages a corresponding receiving contact of the at least one receiving contact disposed along the side-edge surface of the printed circuit board during the temporary communication, and wherein the connector body comprises an additional mating region configured to engage a side-edge surface of an additional printed circuit board, wherein the additional mating region includes an additional at least one electrical contact protruding outwardly from the additional mating region so that each of the additional at least one electrical contact engages a corresponding receiving contact disposed along a side-edge surface of the additional printed circuit board when engaged with the additional mating region;
an adapter configured to physically connect with a connector of the external electronic device so as to receive electrical signals from the external electronic device for at least one of programming, debugging, configuring, monitoring, testing or state configuring the programmable or configurable electronics of the printed circuit board during the temporary communication; and
electronic connections electrically connecting the at least one electrical contact with the adapter so as to allow the electronic signals to pass from the external electronic device to the programmable or configurable electronics of the printed circuit board during the temporary communication so as to accomplish at least one of programming, debugging, configuring, monitoring, testing, or state configuring of the printed circuit board.

35. A connector for temporary communication between programmable or configurable electronics of a printed circuit board and an external electronic device, the connector comprising:
a connector body having a mating region configured to engage a side-edge surface of the printed circuit board, wherein the side-edge surface comprises at least one receiving contact electrically connected to the programmable or configurable electronics, and wherein the mating region includes at least one electrical contact protruding outwardly from the mating region so that each of the at least one electrical contact engages a corresponding receiving contact of the at least one receiving contact disposed along the side-edge surface of the printed circuit board during the temporary communication, and wherein the mating region comprises a receiving platform for receiving a broad planar surface of the printed circuit board adjacent to the side-edge surface while each of the at least one electrical contact engages the corresponding receiving contact;

an adapter configured to wirelessly connect with the external electronic device so as to receive wireless signals from the external electronic device for at least one of programming, debugging, configuring, monitoring, testing or state configuring the programmable or configurable electronics of the printed circuit board during the temporary communication; and electronic connections electrically connecting the at least one electrical contact with the adapter so as to allow the wireless signals to pass from the external electronic device to the programmable or configurable electronics of the printed circuit board during the temporary communication so as to accomplish at least one of programming, debugging, configuring, monitoring, testing, or state configuring of the printed circuit board.

36. A connector for temporary communication between programmable or configurable electronics of a printed circuit board and an external electronic device, the connector comprising:

a connector body having a mating region configured to engage a side-edge surface of the printed circuit board, wherein the side-edge surface comprises at least one receiving contact electrically connected to the programmable or configurable electronics, and wherein the mating region includes at least one electrical contact protruding outwardly from the mating region so that each of the at least one electrical contact engages a corresponding receiving contact of the at least one receiving contact disposed along the side-edge surface of the printed circuit board during the temporary communication, and wherein the connector body comprises an additional mating region configured to engage a side-edge surface of an additional printed circuit board, wherein the additional mating region includes an additional at least one electrical contact protruding outwardly from the additional mating region so that each of the additional at least one electrical contact engages a corresponding receiving contact disposed along a side-edge surface of the additional printed circuit board when engaged with the additional mating region;

an adapter configured to wirelessly connect with the external electronic device so as to receive wireless signals from the external electronic device for at least one of programming, debugging, configuring, monitoring, testing or state configuring the programmable or configurable electronics of the printed circuit board during the temporary communication; and electronic connections electrically connecting the at least one electrical contact with the adapter so as to allow the wireless signals to pass from the external electronic device to the programmable or configurable electronics of the printed circuit board during the temporary communication so as to accomplish at least one of programming, debugging, configuring, monitoring, testing, or state configuring of the printed circuit board.

* * * * *

UNITED STATES PATENT AND TRADEMARK OFFICE
CERTIFICATE OF CORRECTION

PATENT NO. : 10,535,938 B2
APPLICATION NO. : 15/917271
DATED : January 14, 2020
INVENTOR(S) : Sherman et al.

Page 1 of 1

It is certified that error appears in the above-identified patent and that said Letters Patent is hereby corrected as shown below:

In the Claims

Column 24, Line 56 (Claim 17, Line 3): After "testing," and before "state", insert -- or --.

Signed and Sealed this
Fifteenth Day of September, 2020

Andrei Iancu
*Director of the United States Patent and Trademark Office*